United States Patent [19]
Suh et al.

[11] Patent Number: 5,541,879
[45] Date of Patent: Jul. 30, 1996

[54] NONVOLATILE SEMICONDUCTOR MEMORY HAVING PROGRAM VERIFYING CIRCUIT

[75] Inventors: Kang D. Suh, Ahnyang; Jin K. Kim, Seoul; Jeong H. Choi, Kwacheon, all of Rep. of Korea

[73] Assignee: Samsung Electronics Co., Ltd., Suwon, Rep. of Korea

[21] Appl. No.: 441,476

[22] Filed: May 15, 1995

Related U.S. Application Data

[62] Division of Ser. No. 171,300, Dec. 22, 1993, Pat. No. 5,473,563.

[30] Foreign Application Priority Data

Jan. 13, 1993 [KR] Rep. of Korea .................. 390/1993

[51] Int. Cl.$^6$ ........................................ G11C 7/00
[52] U.S. Cl. .................. 365/185.22; 365/189.01; 365/189.05; 365/201
[58] Field of Search ................ 365/185, 189.01, 365/189.05, 189.09, 200, 201

[56] References Cited

U.S. PATENT DOCUMENTS

| | | | |
|---|---|---|---|
| 4,811,294 | 3/1989 | Kobayashi | 365/201 |
| 5,053,990 | 10/1991 | Kreifels | 364/900 |
| 5,321,699 | 6/1994 | Endoh et al. | 365/201 |
| 5,357,462 | 10/1994 | Tanaka et al. | 365/185 |
| 5,379,259 | 1/1995 | Tanaka et al. | 365/189.01 |

FOREIGN PATENT DOCUMENTS

| | | |
|---|---|---|
| 0559213 | 9/1993 | European Pat. Off. . |
| 4132826 | 5/1992 | Germany . |
| 91-17445 | 11/1991 | Rep. of Korea . |
| 2264578 | 9/1993 | United Kingdom . |

OTHER PUBLICATIONS

Momodomi et al, "New Device Technologies for 5V-only 4Mb EEPROM With NAND Structure Cell", CH2528-8/88/0000-0412 IEEE (1988) pp. IEDM 88-412—IEDM 88-415.

Kirisawa et al, "A NAND Structured Cell with a new Programming Technology for Highly Reliable 5V-Only Flash EEPROM", 1990 Symposium on VLSI Technology, 4 Jun. 1990, CH 2874-6, 90/0000-0129 1990 IEEE, Honolulu, US pp. 129-130.

Iwata et al, "A High-Density NAND EEPROM with Block-Page Programming for Microcomputer Applications", IEEE Journal of Solid-State Circuits, vol. 25, 2, Apr. 1990, pp. 417-423.

Momodomi et al, "A 4-Mb NAND EEPROM with Tight Programmed $V_t$ Distribution", IEEE Journal of Solid State Circuits, vol. 26, No. 4, Apr. 1991, pp. 492-495.

Endoh et al "A study of high performance NAND structural EEPROMs", IEICE Transactions on Electronics. vol. E75C, No. 11, Nov. 1992, Tokyo, JP pp. 1351-1356.

*Primary Examiner*—Tan T. Nuguyen
*Attorney, Agent, or Firm*—Cushman Darby & Cushman, L.L.P.

[57] ABSTRACT

A nonvolatile semiconductor memory device according to the present invention includes an array of cell units, each cell unit including at least one memory transistor which has a floating gate and a control gate, the array being divided into a plurality of memory blocks each having a certain number of cell units. The nonvolatile semiconductor memory device operates in a program mode, a program verify mode and a read mode. A current source provides a predetermined electrical current to the bit lines during both data reading and programming modes, and a common data latch stores program data during a write operation, as well as senses and stores data when the nonvolatile memory device is operated in a data read mode and a program verify mode.

30 Claims, 19 Drawing Sheets

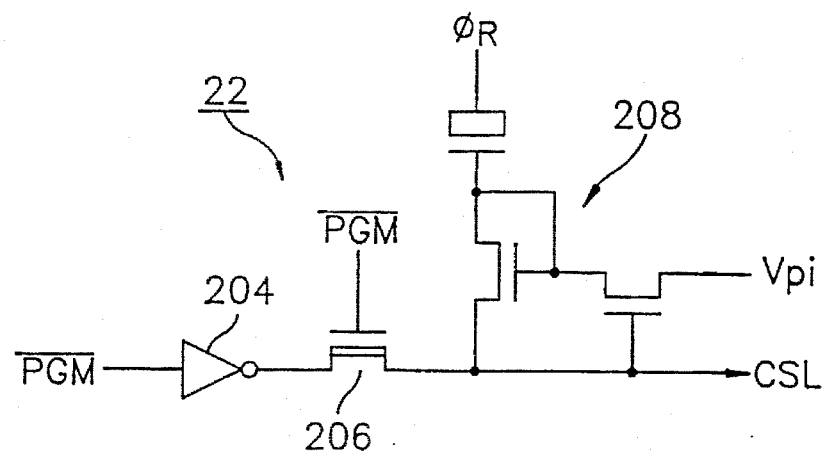
*FIG. 7*
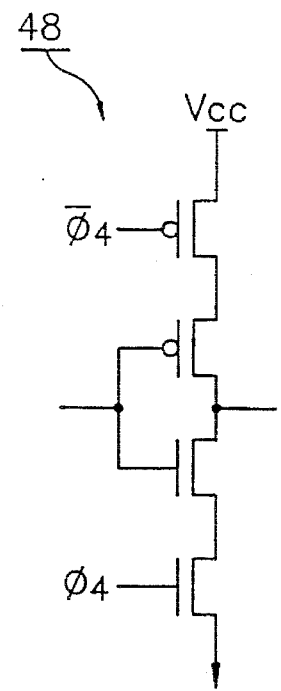
*FIG. 8a*
*FIG. 8*

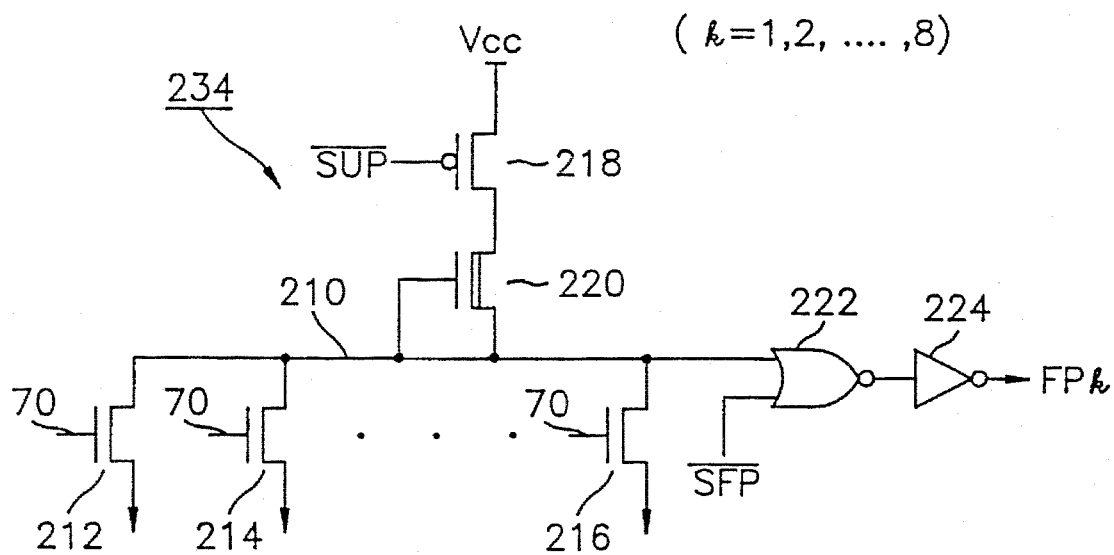
FIG. 9a
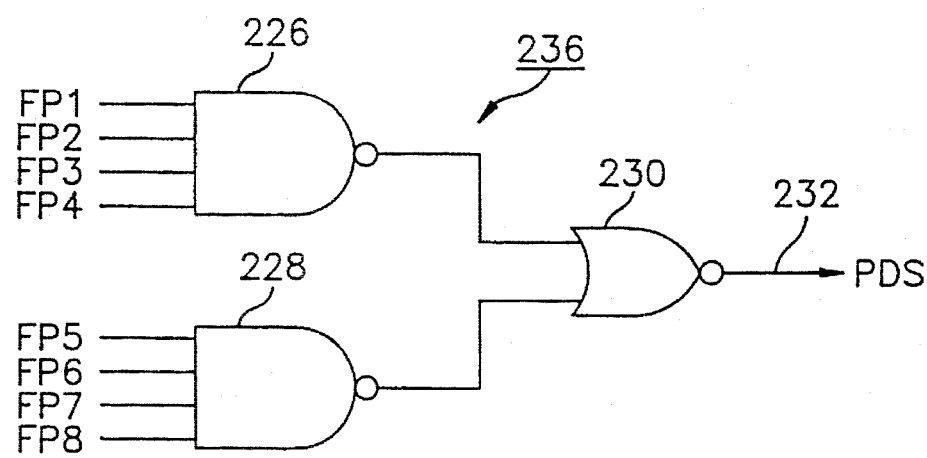
FIG. 9b
FIG. 9

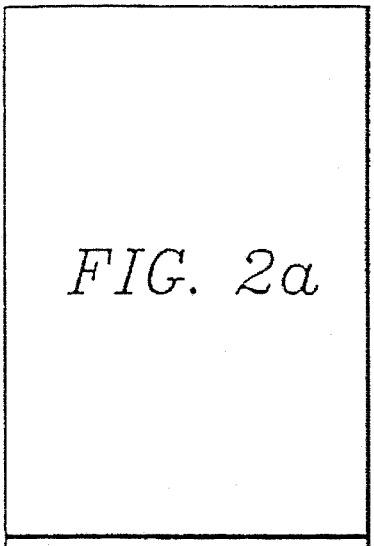
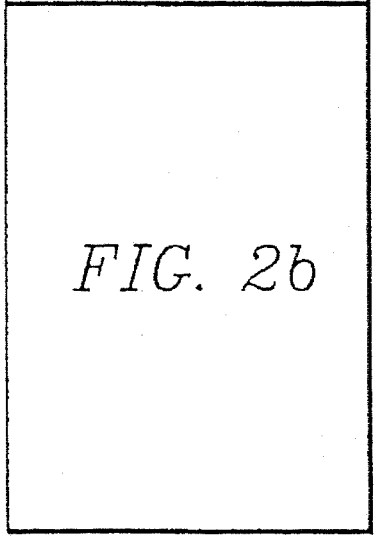
FIG. 2
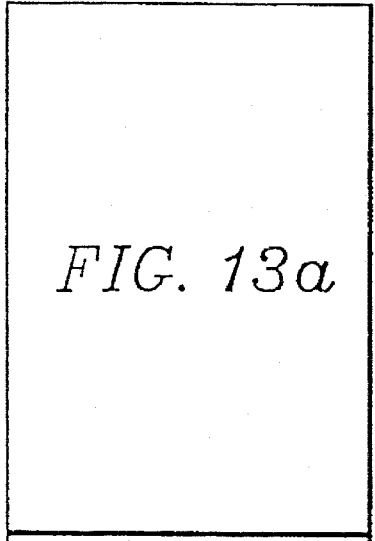
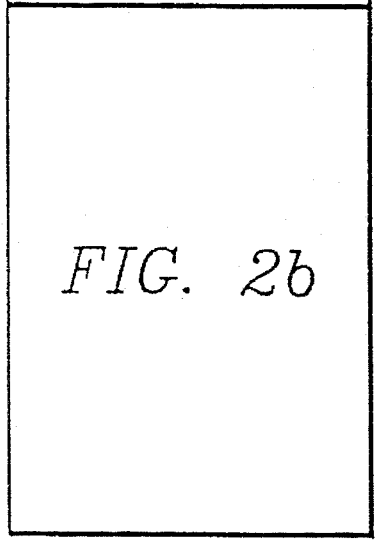
FIG. 13
FIG. 18

NONVOLATILE SEMICONDUCTOR MEMORY HAVING PROGRAM VERIFYING CIRCUIT

This is a division of application Ser. No. 08/171,300, filed Dec. 22, 1993, now U.S. Pat. No. 5,473,563.

FIELD OF THE INVENTION

The present invention relates to electrically erasable and programmable nonvolatile semiconductor memories and, more particularly, but not exclusively, to electrically erasable and programmable nonvolatile semiconductor memories with NAND structured cells.

BACKGROUND OF THE INVENTION

Various systems controlled by recent computers or microprocessors require the development of an electrically erasable and programmable read-only memory (hereinafter referred to as a EEPROM) of a high density. Particularly, since the use of a hard disk with a rotary magnetic disk as a secondary storage occupies a relatively large area in a portable computer system such as a battery-powered computer system of notebook size, system designers take much interest in the development of EEPROMs of high density and high performance occupying a smaller area. To achieve a high density EEPROM, it is a major problem to reduce the area occupied by memory cells. To solve such a problem, an EEPROM has been developed which contains NAND structured cells being capable of decreasing the number of selection transistors per cell and contact holes coupled with a bit line. Such a NAND structured cell is disclosed in the IEDM, pp 412 to 415, 1988 under the title of "NEW DEVICE TECHNOLOGIES FOR 5V-ONLY 4 Mb EEPROM WITH NAND STRUCTURE CELL". This NAND structured cell (hereinafter referred to as a NAND cell unit or a NAND cell) is comprised of a first selection transistor whose drain is connected to the corresponding bit line via a contact hole; a second selection transistor whose source is connected to a common source line; and eight memory transistors whose channels are connected in series between the source of the first selection transistor and the drain of the second selection transistor. The NAND cell is formed on a p-type semiconductor substrate, and each memory transistor includes a floating gate layer formed on a gate oxide layer over a channel region between its source and drain regions and a control gate layer separated from the floating gate layer by an intermediate insulating layer. To program or write a selected memory transistor in the NAND cell, an operation of simultaneously erasing all memory transistors therein must be followed by the programming operation. The simultaneous erasure is performed by applying 0 volts to the bit line and raising the gate of the first selection transistor and control gates of all memory transistors to 17 volts. This causes all memory transistors to be changed into enhancement mode transistors which are assumed as binary logic "1" programmed transistors. To program a selected memory transistor to a binary logic "0", 22 volts are applied to the bit line, the gate of the first selection transistor and control gates of memory transistors between the first selection transistor and the selected memory transistor, while 0 volts are applied to the control gate of the selected memory transistor, control gates of memory transistors between the selected memory transistor and the common source line, and the gate of the second selection transistor. Thus, the selected memory transistor is changed into a depletion mode transistor by the Fowler-Nordheim tunneling (F-N tunneling) of holes from its drain to its floating gate. However, the problem of programming in this manner is that a portion of the gate oxide of the selected memory transistor is subjected to a stress induced by application of the high voltage to its drain, and the partially stressed gate oxide causes leakage current to flow. This results in degrading more and more the data retention capability of the memory cell according to an increase of the number of cycles of erasing and/or programming, thereby reducing the reliability of the EEPROM. To solve this problem, an improved device structure, in which the NAND cells are formed on a p-type well region imbedded in an n-type semiconductor substrate, and further improved erasing and programming technologies utilizing the improved device structure are disclosed in the symposium on VLSI Technology, pp 129 to 130, 1990 under the title of "A NAND STRUCTURED CELL WITH A NEW PROGRAMMING TECHNOLOGY FOR HIGHLY RELIABLE 5V-ONLY FLASH EEPROM".

Erasure of all memory transistors in this NAND cell is performed by applying 0 volts to all control gates and a high potential of 20 volts to the p-type well region and the n-type substrate, thereby uniformly extracting electrons from their floating gates to the well region. As a result, each memory transistor has a threshold voltage of about −4 volts which represents a state of depletion mode, i.e. a logic "0". To program a selected memory transistor in the NAND cell, a high voltage of 20 volts is applied to the gate of the first selection transistor and the control gate of the selected memory transistor, while 0 volts are applied to the gate of the second selection transistor, and an intermediate voltage of 7 volts is applied to control gates of unselected memory transistors. If the selected memory transistor is to be written or programmed into a logic "1", 0 volts are applied to the bit line connected with the NAND cell, thereby injecting electrons into the floating gate of the selected memory transistor. This results in causing the selected memory transistor to become enhancement mode. On the contrary, if the selected memory transistor is to be programmed to a logic "0", a program inhibition voltage of 7 volts instead of 0 volts is applied to the bit line to inhibit the programming of the selected memory transistor. Since such a programming operation uniformly injects electrons from the p-type well to its floating gate via its gate oxide layer, the partial stress on the thin gate oxide layer does not occur to a significant degree, and the gate oxide leakage current may thus be prevented.

However, when the memory capacity becomes high, such ways of uniform erasing and programming cause problems in the case that system designers want to erase a portion or a block of previously written or programmed memory cells in order to reprogram. In this case, a conventional approach is to simultaneously erase all memory transistors in a memory cell array, i.e. to carry out a flash erasure, and then to newly reprogram the content of all programs. Thus, since significantly reusable portions or blocks of the memory array are simultaneously erased, the reprogramming not only needs a long time, but also is inconvenient. It may be appreciated that such problems seriously occur when the memory density becomes higher. To solve these problems, it is made possible only to erase all memory transistors in a selected memory block. However, in the case of an EEPROM using the above-mentioned improved erasing and programming techniques, to prevent the erasing of all memory transistors in an unselected block, it is required that a high voltage equal to an erase voltage or a high voltage of about 18 volts or more be placed on their control gates. Thus, this approach has a drawback that a decoding circuit for performing a block erasing operation becomes complicated in design. In addition, when the density of the EEPROM cells increases, an on-chip occupying area of the decoder increases, thereby making it difficult to design the decoder.

Another problem of the prior art is that of programming. To prevent the programming of non-programmed memory transistors, which must maintain previous data, of memory transistors on a selected word line, it is required that each of the bit lines corresponding to the non-programmed memory transistors be raised to the intermediate, i.e. the program inhibiting voltage, via a charge pump circuit connected thereto. In addition, when the memory capacity is increased, the number of bit lines or the length of each bit line is increased. Consequently, it is necessary that a high voltage generating circuit on the same chip for supplying the high voltages to the charge pump circuits has a high performance. Such a high voltage generating circuit and the charge pump circuits give a problem in increasing the area occupied by the on-chip peripheral circuits.

Conventional EEPROMs include a page program mode for high-speed programming. The page programming operation is composed of a data loading operation and a programming operation. The data loading operation comprises sequentially latching or storing data of a byte size from input/output terminals to a data register. The programming operation comprises simultaneously writing the data stored in the data register into memory transistors on a selected word line via bit lines. The page programming technology on an EEPROM with NAND cells is disclosed in the IEEE JOURNAL OF SOLID-STATE CIRCUITS, VOL. 25, NO. 2, pp 417 to 423, APRIL 1990.

Conventional EEPROMs employ a programming verification technique to enhance their reliability. The verification means checking to determine if programmed cells are programmed so as to have desired threshold voltages. Technologies of the programming verification may be classified into an external verification technique controlled by a microprocessor and an internal verification technique performed by an on-chip verification circuit. The external verification technique is disclosed in the IEEE JOURNAL OF SOLID-STATE CIRCUITS, VOL. 26, NO. 4, pp 492 to 495, April 1991 and U.S. PAT. NO. 5,053,990. The external verification technique has a problem in that it takes a predetermined long time to determine if programmed cells are well programmed. In addition, whenever reprogramming is performed after the failure of the programming, it is necessary that the data loading operation is performed again. However, the internal verifying technique has an advantage that the programming verification is performed at a higher speed. The internal verifying technique is disclosed in Korean Patent Laid Open NO. 91-17445 and U.S. PAT. NO. 4,811,294. In these documents, the verification is performed in such a manner that comparator means compare data stored in a data register with data read out in pages from memory cells via sense amplifiers. However, such a scheme employing comparator means increases the area occupied by on-chip peripheral circuits.

SUMMARY OF THE INVENTION

It is therefore an object of the present invention to provide a nonvolatile semiconductor memory with NAND structured cells which can reduce the size of chip.

It is another object of the present invention to provide a nonvolatile semiconductor memory with NAND structured cells which can reduce power consumption.

It is further object of the present invention to provide a nonvolatile semiconductor memory which performs an erasing of selected one of memory blocks.

It is still further object of the present invention to provide a nonvolatile semiconductor memory which is programmable without application of a program inhibition voltage of high voltages on unselected bit lines in order to reduce a chip size and power consumption.

It is another object of the present invention to provide methods for block erasing and programming which are capable of reducing on-chip occupying area and power consumption in a nonvolatile semiconductor memory with NAND structured cells.

It is another object of the present invention to provide a nonvolatile semiconductor memory in which on-chip area of peripheral circuits can be reduced in size.

It is further object of the present invention to provide a nonvolatile semiconductor memory in which over programming can be prevented. According to an aspect of the present invention, there is included an array of cell units, each cell unit including at least one memory transistor which has a floating gate and a control gate, the array being divided into a plurality of memory blocks each having a certain number of cell units. The nonvolatile semiconductor memory device operates in a program mode, a program verify mode and a read mode. A current source provides a predetermined electrical current to the bit lines during both data reading and programming modes, and a common data latch stores program data during a write operation, as well as senses and stores data when the nonvolatile memory device is operated in a data read mode and a program verify mode.

BRIEF DESCRIPTION OF DRAWING

For a better understanding of the invention, and to show how embodiments of the same may be carried into effect, reference will now be made, by way of example, to the accompanying diagrammatic drawings, in which:

FIG. 2 is comprised of FIGS. 2a and 2b.

FIG. 7 shows a schematic circuit diagram of a source line driving circuit used in the embodiment of FIG. 2;

FIG. 8a shows a circuit diagram of a tristate inventer used in FIG. 2b;

FIG. 9 shows a program determination circuit and is comprised of FIGS. 9a and 9b, in which FIG. 9a is a circuit diagram showing a portion of the program determination circuit and FIG. 9b is a circuit diagram showing a summation circuit;

FIG. 13 is a circuit diagram showing a schematic modified embodiment and is comprised of FIGS. 13a and 2b, in which

FIG. 18 is a diagram showing the manner in which the separate sheets of drawings of FIGS. 2a and 2b, and FIGS. 13a and 2b.

In the figures, like reference numerals denote like or corresponding parts.

DETAILED DESCRIPTION OF THE PREFERRED EMBODIMENTS

In the following description, numerous specific details, such as memory cells, the number of NAND cells, the number of bit lines, the value of voltages, circuit elements and parts and so on, are set forth in order to provide a thorough understanding of the present invention. It will be understood by those skilled in the art that other embodiments of the present invention may be practiced without these specific details, or with alternative specific details.

The term "memory transistor" as used herein refers to a floating gate MOS FET having a source, a drain, a floating gate and a control gate. The term "programming" is used to describe the writing of data into selected memory transistors. The term "NAND cell charging" is defined as the charging of the channel and the source and drain junction capacitors of respective memory transistors constituting the NAND cell to a predetermined potential.

In the following description, symbols k and i are respectively used for those parts associated with a k-th column block and an i-th memory block. Symbol j represents a notation associated with a j-th word line.

The term "ground potential" (or like terms such as "ground 'voltage'" or "earth' potential or voltage") is used conveniently in this specification to denote a reference potential. As will be understood by those skilled in the art, although such reference potential may typically be zero potential, it is not essential that it is so, and may be a reference potential other than zero.

An example of an EEPROM of the present invention is fabricated by using CMOS manufacturing technologies on a common chip, in which depletion mode n-channel MOS transistors each having a threshold voltage of −2 to −3 volts (hereinafter referred to as D-type transistors), enhancement mode n-channel MOS transistors each having a threshold voltage of about 0.7 volts (hereinafter referred to as n-channel transistors) and p-channel MOS transistors each having a threshold voltage of about −0.9 volts (hereinafter referred to as p-channel transistors) are employed.

Figure 1:
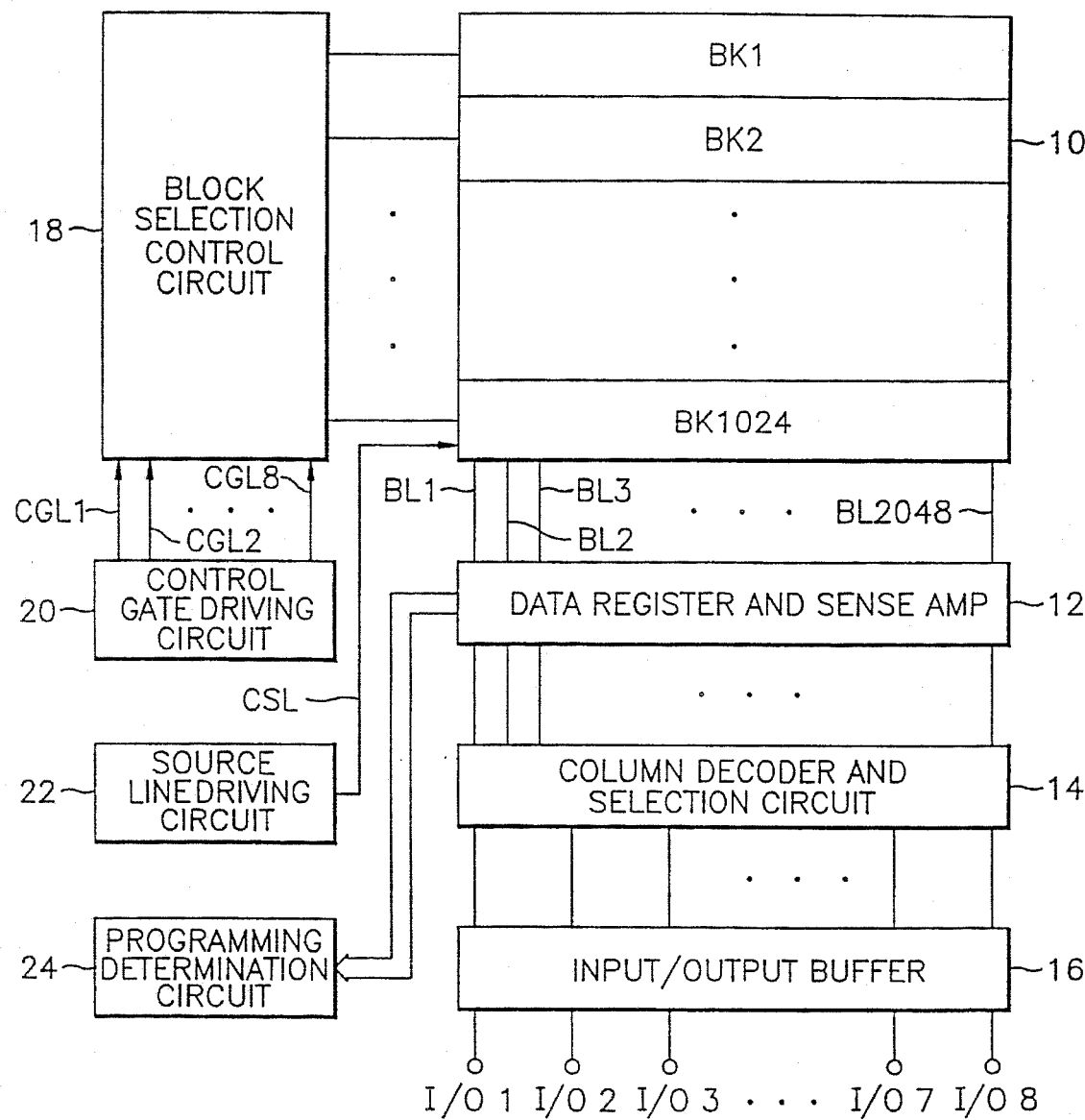
FIG. 1 shows a schematic block diagram of an electrically erasable and programmable read-only memory according to the present invention.

FIG. 1 illustrates a schematic block diagram of one example of an EEPROM according to the present invention.

Figure 2A:
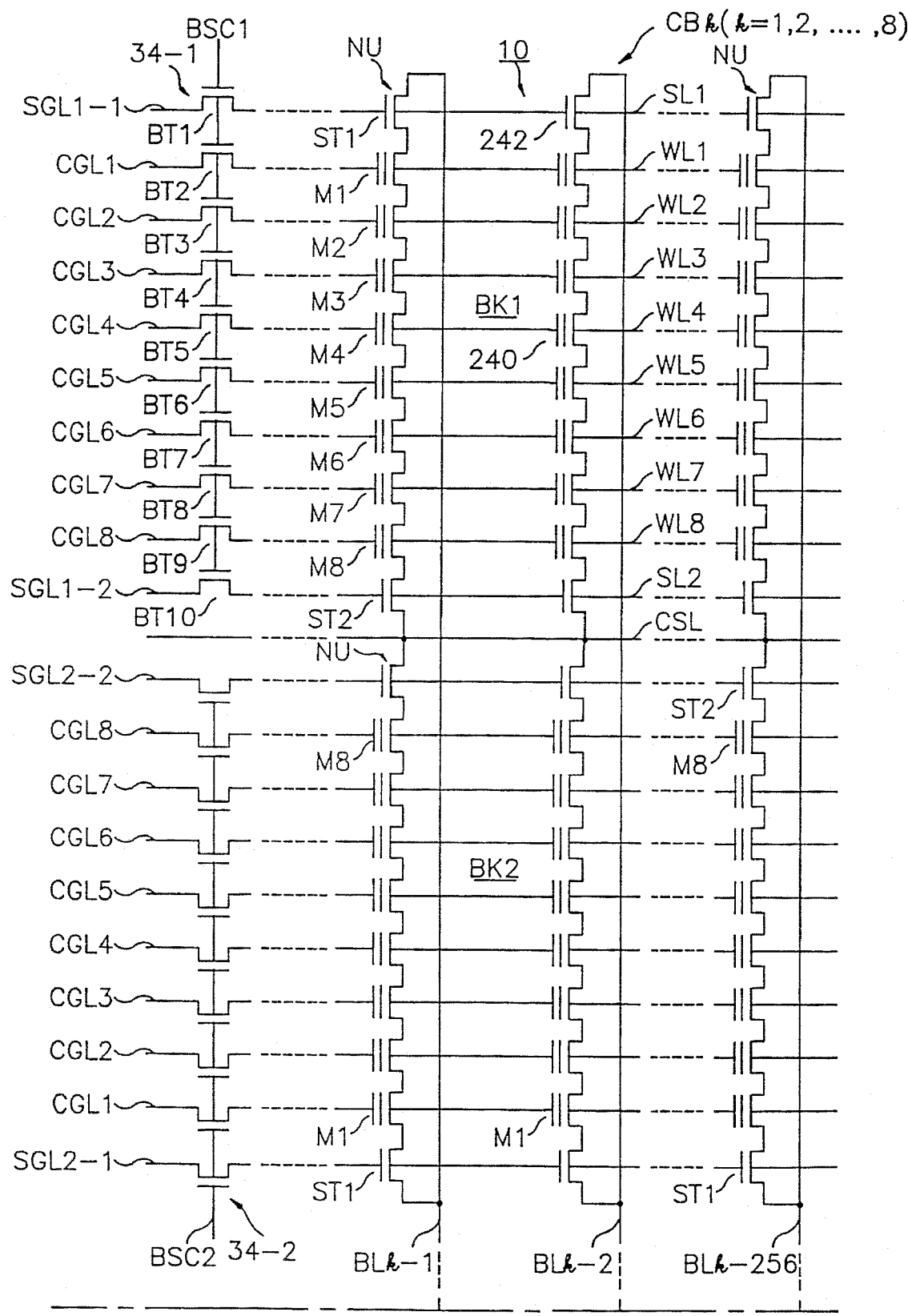
FIG. 2a illustrating the arrangement of memory cells within first and second memory blocks associated with a k-th column block, and transfer transistor arrays connected thereto.
Figure 2B:
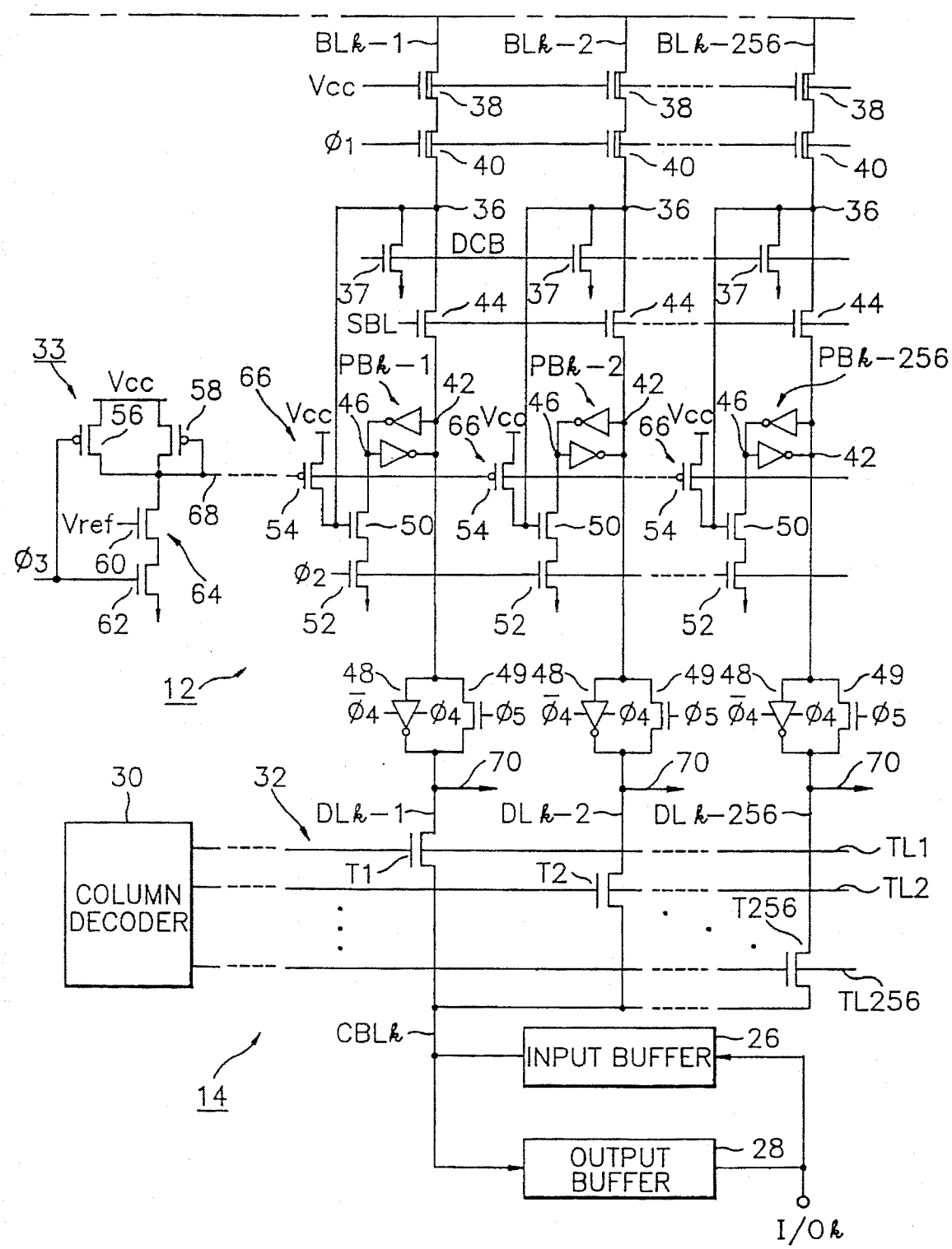
FIG. 2b showing an input/output buffer, a column decoder and selection circuit, a data register and sense amplifiers associated with the k-th column block.

FIG. 2 is composed of FIG. 2a and FIG. 2b in parallel relationship with each other, and shows, for the convenience of illustration, only those elements associated with the k-th input/output terminal I/Ok, a memory cell array 10, input and output buffers 26 and 28, a column decoder 30, a column selection circuit 32, a data register and sense amplifier 12 and a transmission transistor array 34-i which is connected with the memory cell array 10 and constitutes a portion of a block selection control circuit 18. It should be noted that elements associated with the remaining input/output terminals are identical to those associated with the terminal I/Ok.

Referring now to FIGS. 1 and 2, the memory cell array 10 of the present EEPROM is composed of NAND cells NU arranged in a matrix form of 1,024 rows and 2,048 columns, and includes 1,024 memory blocks BK1 to BK1024 divided in a row direction. Each NAND cell is composed of memory transistors M1 to M8 whose drain-source paths are connected in series between the source of a first selection transistor ST1 and the drain of a second selection transistor ST2. Gates of the first and second selection transistors ST1 and ST2 and control gates of the memory transistors M1 to M8 are respectively connected to first and second selection lines SL1 and SL2 perpendicular to bit lines BLk-1 to BLk-256 (k=1,2, ..., 8) and word lines WL1 to WL8. Thus, the memory transistors M1 to M8 are disposed at intersections of the word lines WL1 to WL8 and the bit lines BLk-1 to BLk-256. Drains of the first selection transistors ST1 are respectively connected with corresponding bit lines, and sources of the second selection transistors ST2 are connected to a common source line CSL. Consequently, the memory cell array 10 is comprised of memory cells of a total of 1,024×8×2,048 (=16,777,216), and each memory block is comprised of memory cells of a total of 8×2,048 (=16,384). The memory cell array 10 is divided into eight column blocks Bk (k=1,2, ..., 8) respectively corresponding to input/output terminals I/O1 to I/O8, and each column block has 256 bit lines or column lines which are parallel in a column direction. Thus, each column block includes memory cells totalling 256 Kbit (=1,024×256).

Figure 3:
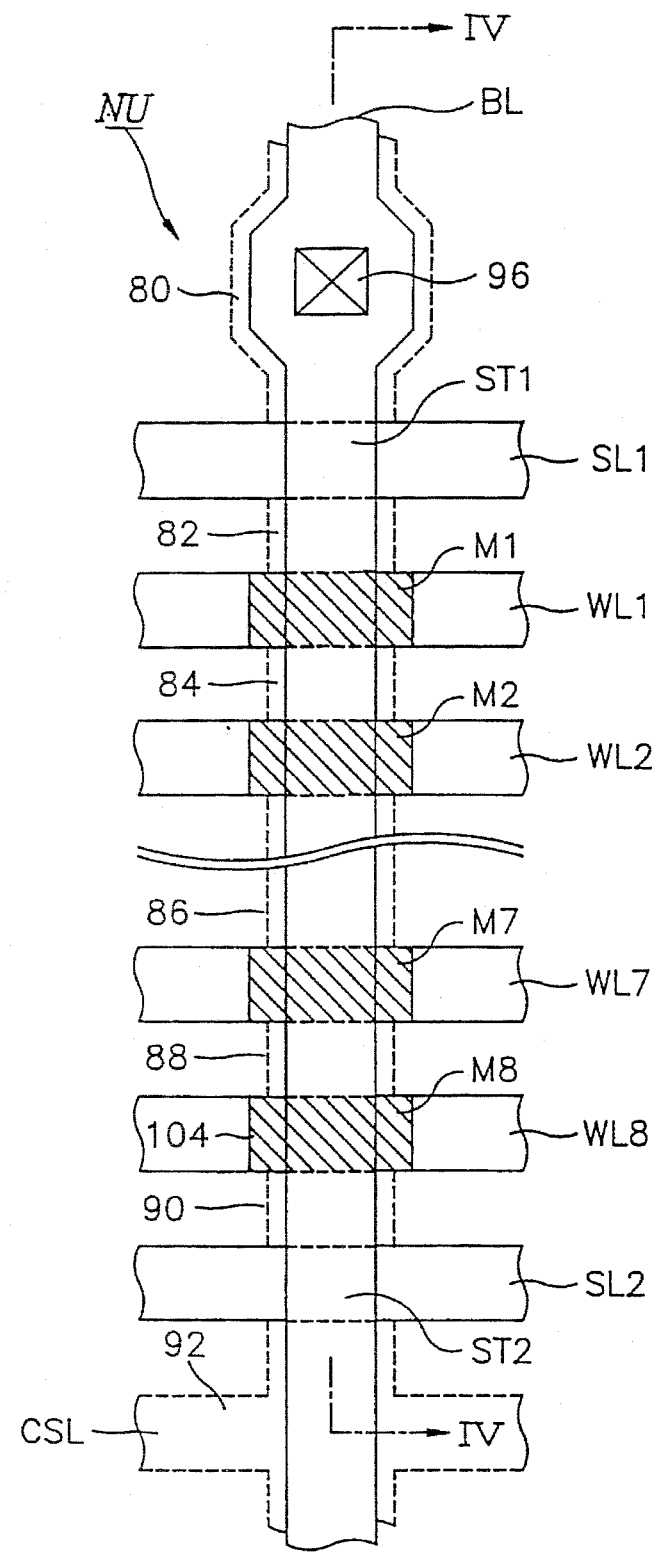
FIG. 3 shows a plan view of a layout pattern for one of a plurality of NAND cells constituting a memory cell array.
Figure 4:
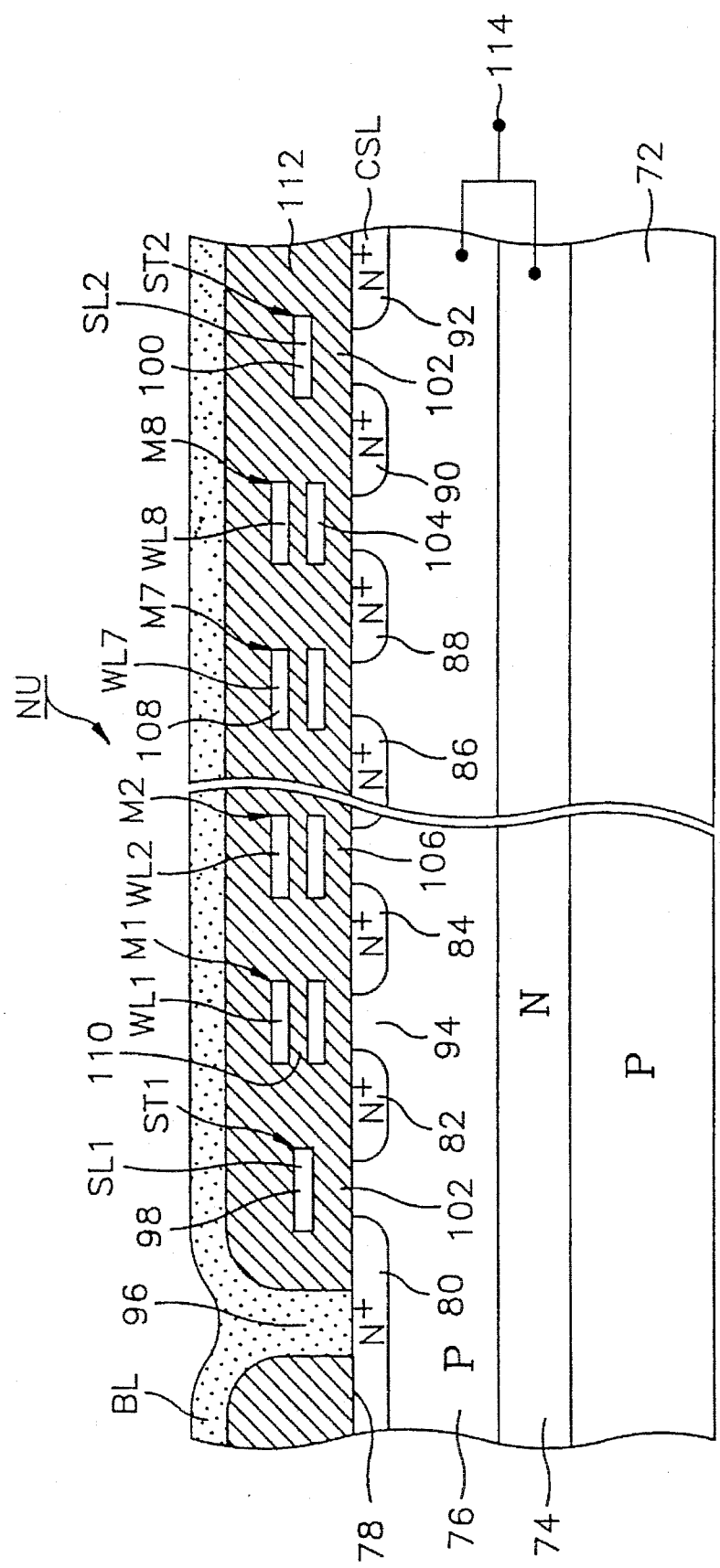
FIG. 4 shows a cross-sectional view of the NAND cell taken substantially along line IV—IV of FIG. 3.

The memory cell array 10 is formed on a p-well region in a semiconductor substrate. FIGS. 3 and 4 respectively show a plan view and a cross-sectional view of one of the NAND cells NU constituting the memory cell array 10.

Referring to FIGS. 3 and 4, the semiconductor substrate 72 is of a p-type silicon monocrystalline material which is cut on the (1,0,0) crystal orientation at an impurity concentration of about 7×10¹⁴ atoms/cm³. A p-type well region 76 with an impurity concentration of about 2×10¹⁶ atoms/cm³ is formed having a depth of about 4 μm from a main surface 78 of the substrate 72. The well region 76 is surrounded by a n-type well region 74 of about 10 μm in depth with an impurity concentration of about 5×10$^{15}$ atoms/cm$^3$. Heavily doped N$^+$ regions 80 to 92 are formed on the main surface 78 of the well region 76 and separated by each of a plurality of channel regions 94. One part of the N$^+$ region 80 is a contact region connected via a contact hole 96 to a bit line BL of a metal material, such as an aluminum, which extends over an insulation layer 112, and the other part of the N$^+$ region 80 also serves as a drain region of the first selection transistor ST1. The N$^+$ regions 82 to 90 serve as common source-drain regions of two adjacent transistors of transistors ST1, M1 to M8 and ST2. One part of the N$^+$ region 92 is a source region of the second selection transistor ST2, and the other part of the N$^+$ region 92 serves as buried common source line CSL. However, the line CSL may be a conductor layer which is insulatively formed within the insulating layer 112 contacting with the N$^+$ source region 92 of the transistor ST2 via a contact hole. Gate layers 98 and 100 of a refractory metal silicide material, such as a tungsten silicide, each of which has a thickness of about 1,500Å, are respectively formed on gate insulating layers 102 of about 300Å thickness, overlying channel regions of the first and second selection transistors ST1 and ST2.

Floating gate layers 104 of a polycrystalline silicon material are insulatively formed with a thickness of about 1,500Å on gate insulating layers 106 of about 100Å thickness overlying channel regions 94 of memory transistors M1 to M8, respectively. Control gates 108 of the same material and thickness as the gate layers 98 and 100 are respectively formed over the floating gate layers 104 interposing intermediate insulating layers 100, such as ONO insulating layers of silicon dioxide-silicon nitride-silicon dioxide materials, of about 250Å thickness. The gate layers 98 and 100 and the control gate layers 108 are respectively shared by the first and second selection lines SL1 and SL2 and word lines WL1 to WL8, i.e. conductor layers which are fabricated from the same material as the gate and control gate layers 98, 100 and 108. The gate layers 98 and 100, control gate layers 108, floating gate layers 104, the first and second selection lines SL1 and SL2, and word lines WL1 to WL8 are insulated from one another with an insulating layer 112 of insulating materials, such as a silicon dioxide and a BPSG or a PSG.

The bit line BL is connected with the contact region 80 via the contact hole 96 and extends in a column direction on the insulating layer 112. The p-type well region 76 and the n-type well region 74 are connected to a well electrode 114 in common via contact holes (not shown). An erasing voltage is applied to the well electrode 114 in an erasing operation, and a reference potential, i.e. ground potential, is applied to the well electrode 114 in operations except the erasing operation, i.e. in programming, programming verification and reading operations. However, the substrate 72 is always at the reference potential. The memory cell array 10 may also be formed on a p-type well region formed in an n-type monocrystalline silicon substrate.

Returning now to FIGS. 1 and 2, the block selection control circuit 18 serves to select a predetermined memory block of the memory blocks BK1 to BK1024, and to provide control signals on control gate lines CGL1 to CGL8 from a control gate driving circuit 20 to word lines WL1 to WL8 in the selected memory block according to various operation modes, such as the erasing, programming, programming verification and reading modes. In FIG. 2a, illustration is made of transfer transistor arrays 34-i constituting a portion of the block selection control circuit 18. Each of the transfer transistor arrays 34-i includes transfer transistors BT1 to BT10 for connecting the first and second selection gate lines SGLi-1 and SGLi-2 and control gate lines CGL1 to CGL8 to the first and second selection lines SL1 and SL2 and word lines WL1 to WL8, respectively.

According to one feature of the illustrated embodiment of the present invention, the block selection control circuit 18 renders nonconductive the transfer transistors associated with unselected memory blocks in an erasing operation, thereby causing word lines in unselected memory blocks to become floating. In a programming operation, the block selection control circuit 18 renders conductive the second transistor ST2 in a selected memory block, thereby charging the program inhibition voltage from a source line driving circuit 22 to channels and source and drain junctions of memory transistors in the selected memory block.

Figure 5:
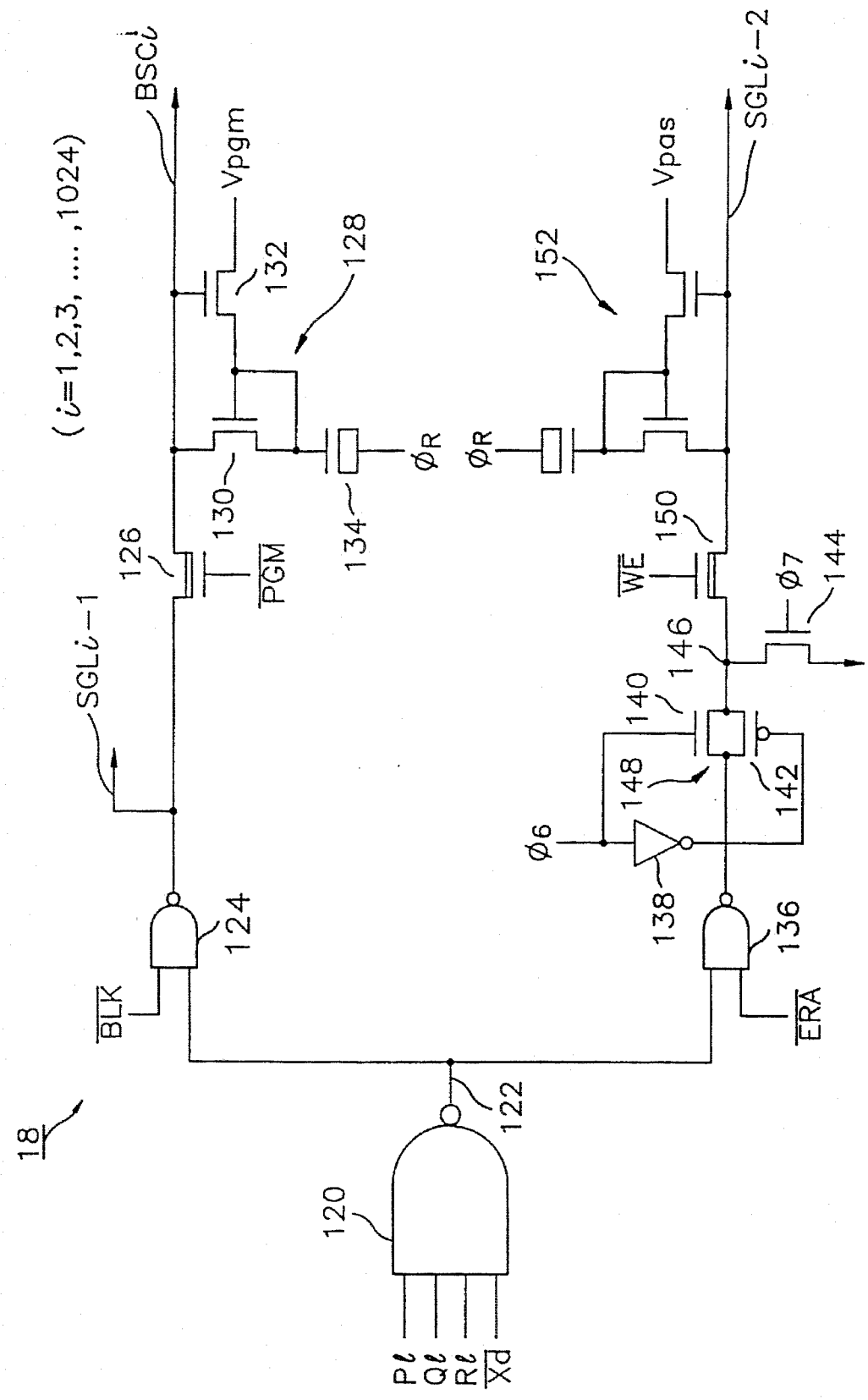
FIG. 5 shows a schematic circuit diagram of a block selection control circuit used in an embodiment of FIG. 2.

FIG. 5 shows a schematic circuit diagram for a block selection control circuit 18 connected to a transfer transistor array 34-i of FIG. 2a. For example, in the case of i=2, lines SGL2-1, SGL2-2 and BSC2 of FIG. 5 are respectively connected to lines SGL2-1, SGL2-2 and BSC2 of the transfer transistor array 34-2 associated with the second memory block BK2 as shown in FIG. 2a. Thus, it should be understood that though FIG. 5 shows, for the convenience of illustration, only a single circuit for selecting the i-th memory block BKi, the block selection control circuit of FIG. 5 corresponding to each of memory blocks BK1 to BK1024 resides on the present EEPROM chip as a peripheral circuit.

Referring now to FIG. 5, NAND gate 120 is a row decoder for receiving address signals Pl, Ql and Rl and a reset signal $\overline{Xd}$. The address signals Pl, Ql and Rl are signals predecoded by row address signals from a predecoder (not shown) for predecoding row address signals $A_{11}, \overline{A_{11}}$ to $A_{20}$, $\overline{A_{20}}$ which are output from an address buffer for storing a row address $a_{11}$ to $a_{20}$ from external address input terminals. The row decoder 120 provides a logic low state of 0 volts (hereinafter referred to as an "L" state or an "L" level) on a line 122 when selected, and outputs a logic high state of 5 volts (hereinafter referred to as an "H" state or an "H" level) thereon when unselected. Two input terminals of NAND gate 124 are connected to the line 122 and a signal $\overline{BLK}$, respectively. The signal $\overline{BLK}$ is a control signal for setting word lines WL1 to WL8 to the reference potential before or after the respective operations, as will be discussed hereinafter. The output of the NAND gate 124 is connected to the first selection gate line SGLi-1 and to the block selection control line BSCi via a current path of D-type transistor 126 for inhibiting the transfer of a high voltage. The gate of the transistor 126 is connected to a program control signal $\overline{PGM}$ for maintaining an "L" state in a programming operation. A charge pump circuit 128 is connected with the block selection control line BSCi for providing, when the line BSCi is selected, a program voltage $V_{pgm}$ on the line BSCi by the pumping of a clock $\phi_R$ in the programming operation. The charge pump circuit 128 is a known circuit comprised of n-channel transistors 130 and 132 and a MOS capacitor 134.

Two input terminals of NAND gate 136 are respectively connected with an erase control signal $\overline{ERA}$ and the line 122. A transfer gate 148 composed of n-channel transistor 140 and p-channel transistor 142 is connected between the output of the NAND gate 136 and a connecting node 146. The gate of n-channel transistor 140 is connected to a control signal $\phi_6$, and the gate of p-channel transistor 142 is connected to the complement signal of $\phi_6$ via an inverter 138. The current path of n-channel transistor 144 is connected between the node 146 and the reference potential, and its gate is connected with a control signal $\phi_7$. The source-to-drain current path of D-type transistor 150 for preventing the transfer of a high voltage is connected between the node 146 and the second selection gate line SGLi-2, and its gate is connected to a control signal $\overline{WE}$. A charge pump circuit 152 having the same construction as the circuit 128 is connected to the second-selection gate line SGLi-2 for providing a pass voltage $V_{pas}$ thereon during the programming operation when the line SGLi-2 is selected.

Figure 8B:
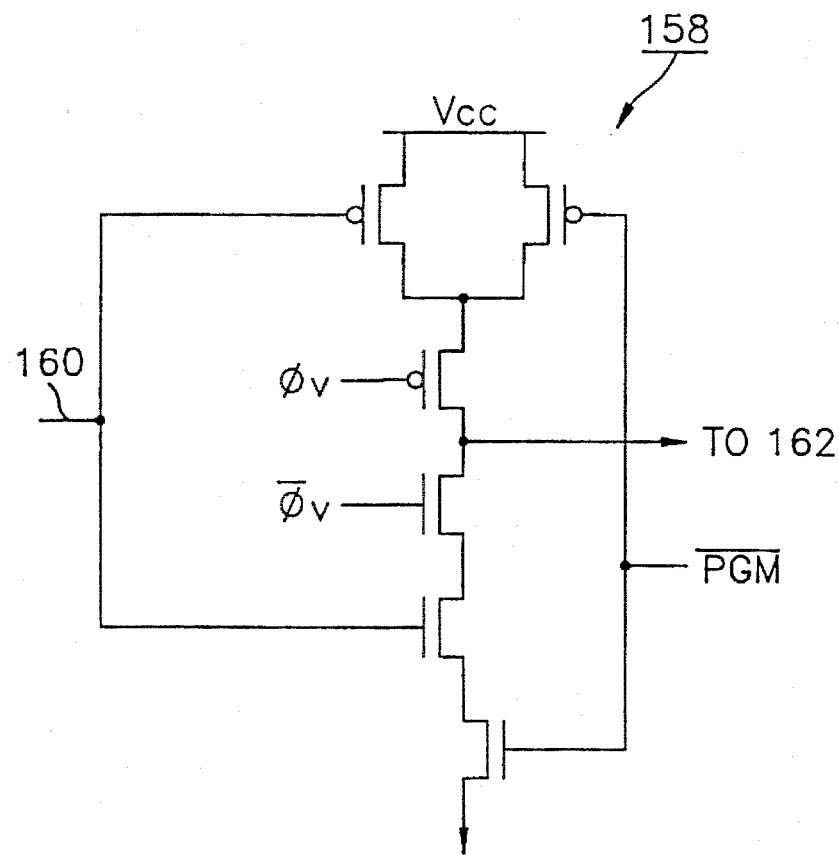
FIG. 8b shows a circuit diagram of a tristate NAND gate used in FIG. 6.
Figure 8C:
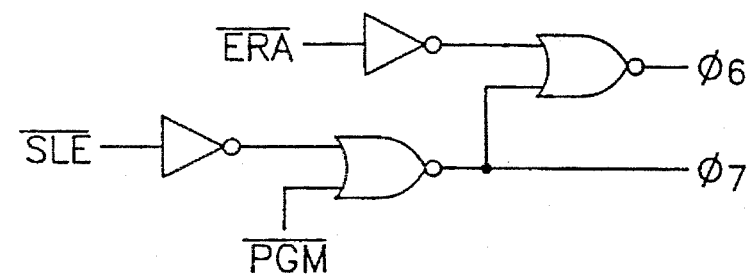
FIG. 8c shows a schematic timing circuit diagram for generating control signals φ₆ and φ₇ used in the block selection control circuit of FIG. 5.

FIG. 8c is a schematic circuit diagram for generating the control signals $\phi_6$ and $\phi_7$ as used in FIG. 5. In an erasing operation or mode, $\phi_6$ and $\phi_7$ are all in "L" states, and in a NAND cell charging operation as will be discussed later, $\phi_6$ is in "H" state and $\phi_7$ is in "L" state. In programming verification and reading operations, $\phi_6$ is in "H" state and $\phi_7$ is in "L" state.

Figure 6:
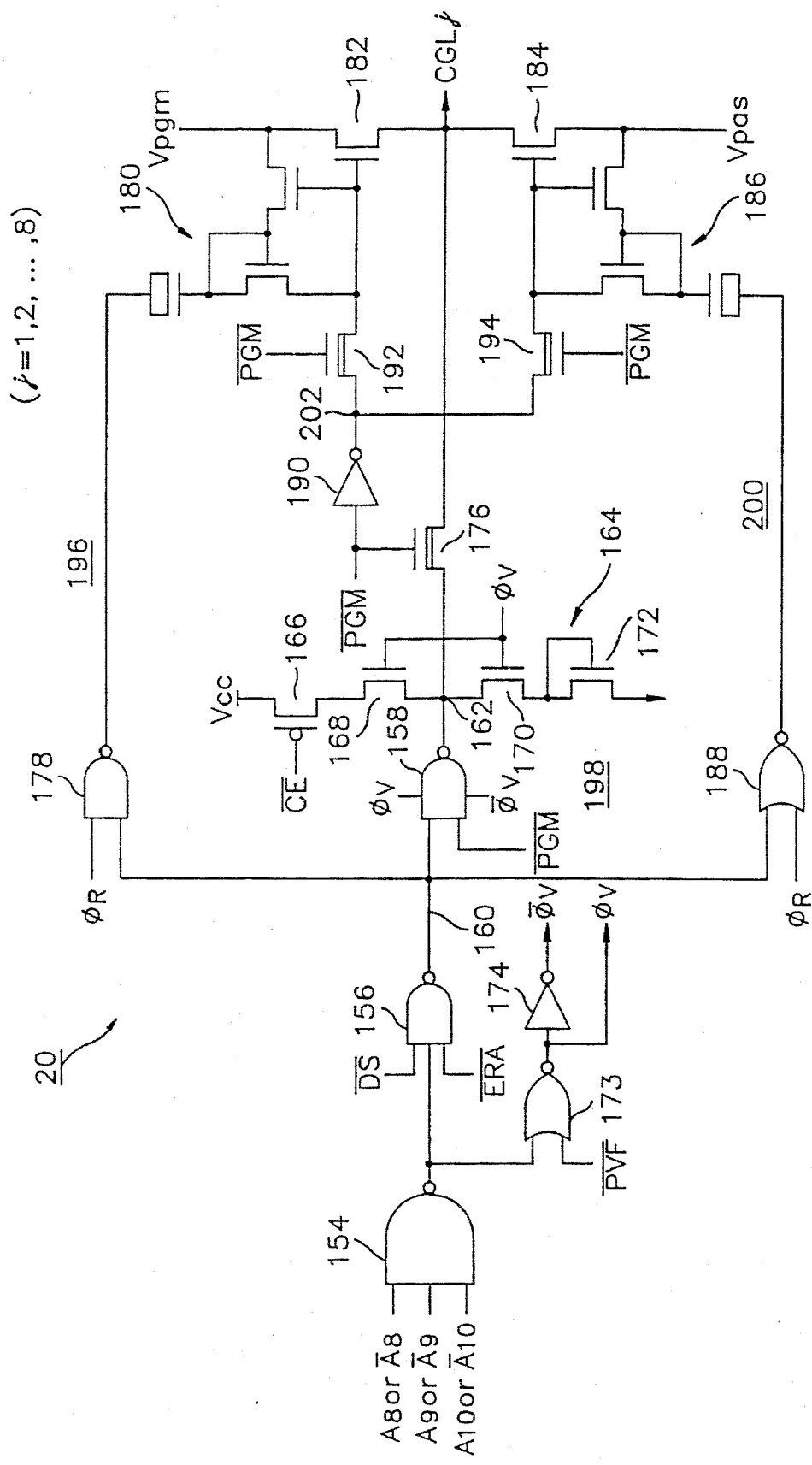
FIG. 6 shows a schematic circuit diagram of a control gate driving circuit used in embodiments of FIG. 2 and FIG. 13.

FIG. 6 illustrates one of eight control gate driving circuits, i.e. the j-th control gate driving circuit which constitutes control gate driving means and is associated with the j-th word line. The outputs of the control gate driving circuits are respectively connected to control gate lines CGL1 to CGL8 which are respectively connected to word lines WL1 to WL8 via transfer transistor arrays 34-i. From the point of view of reduction of total chip size, it would be preferable that the control gate driving circuits be provided in common in an on-chip peripheral circuit so as to drive word lines of a selected memory block according to various operation modes.

Referring now to FIG. 6, NAND gate 154 is a row decoder receiving row address signals $A_8/\overline{A_8}$, $A_9/\overline{A_9}$ and $A_{10}/\overline{A_{10}}$ from address buffer (not shown). The decoder 154 outputs "L" state upon selection of the line CGLj while outputting "H" state upon unselection thereof. The output of the decoder 154 and a control signal $\overline{PVF}$ are respectively connected to two input terminals of NOR gate 173. An output signal $\phi_v$ of the NOR gate 173 and its complement signal $\overline{\phi_v}$ an inverter 174 are provided to control a tristate NAND gate 158 and a verifying voltage generator 164. The control signal $\overline{PVF}$ maintains an "L" state only in a programming verification operation. Thus, in every operation excepting the programming verification operation, the control signal $\overline{PVF}$ stays at "H" level, thereby causing the signal $\phi_v$ to be in an "L" state while causing the signal $\overline{\phi_v}$ to be in an "H" state. In the programming verification operation, if the line CGLj is selected, $\phi_v$ becomes "H" state and its complement $\overline{\phi_v}$ becomes "L" state while, if the line CGLj is unselected, $\phi_v$ becomes "L" state and $\overline{\phi_v}$ becomes "H" state. NAND gate 156 inputs the output of the decoder 154 and control signals $\overline{DS}$ and $\overline{ERA}$, respectively. Two input terminals of the tristate NAND gate 158 are respectively connected to an output line 160 of the NAND gate 156 and the control signal $\overline{PGM}$. The tristate NAND gate 158 illustrated in FIG. 8b is enabled in response to $\phi_v$ at "L" level and $\overline{\phi_v}$ at "H" level while becoming high impedance with $\phi_v$ at "H" level and $\overline{\phi_v}$ at "L" level. Thus, in the programming verification operation, the NAND gate 158 stays in the high impedance state only at the time when the line CGLj is selected. The output of the NAND gate 158 is connected to a connecting node 162 to which the verifying voltage generator 164 is connected.

The verifying voltage generator 164 is comprised of a p-channel transistor 166 and n-channel transistors 168, 170 and 172 whose current paths are connected in series between the power supply voltage Vcc and the reference potential. The gate of the p-channel transistor 166 is connected to a chip enable signal $\overline{CE}$, and gates of the transistors 168 and 170 are connected to the signal $\phi_v$ from the NOR gates 173. Drain and gate of the transistor 172 are connected in common. The verifying voltage generator 164 is enabled by $\phi_v$ at "H" level only in the programming verification operation, thereby producing a verifying voltage of about 0.8 volts to the connecting node 162. Connected between the connecting node 162 and the control gate line CGLj is the source-to-drain current path of D-type transistor 176 for inhibiting the transfer of a high voltage, the gate of which is connected to the control signal $\overline{PGM}$.

Two input terminals of NAND gate 178 are respectively connected to the output of the NAND gate 156 and the clock $\phi_R$ from a ring oscillator (not shown). Between the output of the NAND gate 178 and the gate of a driving n-channel transistor 182 is connected a charge pump circuit 180 which has the same construction as the above-mentioned charge pump circuit. Drain and source of the transistor 182 are connected to the program voltage $V_{pgm}$ and the control gate line CGLj, respectively. Inverter 190 receives the program control signal $\overline{PGM}$, and the current path of D-type transistor 192 for preventing the transfer of a high voltage is connected between the output of the inverter 190 and the gate of the transistor 182 which is connected to the control signal $\overline{PGM}$. As will be discussed hereinafter, a circuit 196 which is comprised of NAND gate 178, the charge pump circuit 180 and the driving transistor 182 provides means for supplying the program voltage $V_{pgm}$ to the control gate line CGLj when the line CGLj has been selected by row address signals $A_8/\overline{A_8}$, $A_9/9$ and $A_{10}/\overline{A_{10}}$ in a program Two input terminals of NOR gate 188 are respectively connected to the output of the NAND gate 156 and the clock Between the output of the NOR gate 188 and the gate of a driving n-channel transistor 184 is connected a charge pump circuit 186. Drain and source of the transistor 184 are respectively connected to the pass voltage $V_{pas}$ and the control gate line CGLj. Between a connecting node 202 and the gate of the transistor 184 is connected the current path of D-type transistor 194 for preventing the transfer of a high voltage, the gate of which is connected to the control signal $\overline{PGM}$. As will be discussed hereinafter, a circuit 200 which is comprised of NOR gate 188, the charge pump circuit 186 and the driving transistor 184 provides means for supplying the pass voltage $V_{pas}$ to the control gate line CGLj when the line CGLj is selected by the row address signals in the program mode.

FIG. 7 shows a schematic circuit diagram of a source line driving circuit which is connected in common to the common source line CSL as shown in FIG. 2a. The source line driving circuit 22 is composed of an inverter 204 whose input terminal is connected to the control signal $\overline{PGM}$, a D-type transistor 206 whose current path is connected between the output terminal of the inverter 204 and the common source line and whose gate is connected to the control signal $\overline{PGM}$, and a charge pump circuit 208 connected to the common source line CSL. The charge pump circuit 208 serves to boost the common source line to a program inhibition voltage $V_{pi}$ in the program mode.

The input/output buffer 16 is comprised of the input buffer 26 and the output buffer 28 which are each connected to input/output terminals. The input buffer 26 connected to each of input/output terminals I/O1 to I/O8 is a conventional circuit for converting a byte of data (8-bit data) therefrom to CMOS level data and temporarily storing it. Output buffers 28 are conventional circuits to simultaneously output 8-bit data read out from the corresponding column blocks to the corresponding input/output terminals.

The column decoder and selection circuit 14 of FIG. 2b is comprised of the column decoder 30 and the column selection circuit 32. The column selection circuit 32 associated with each of the column blocks is comprised of transfer transistors T1 to T256, source-to-drain paths of which are respectively connected between a common bus line CALK and lines DLk-1 to DLk-256. Gates of the transfer transistors T1 to T256 are respectively connected to parallel lines TL1 to TL256 which are connected to the column decoder 30. The column decoder 30 selects one of the lines TL1 to TL256 in response to column address signals from address buffers (not shown), thereby rendering conductive transfer transistors connected with the selected line.

The data register and sense amplifier 12 is connected between the lines DLk-1 to DLk-256 and bit lines BLk-1 to BLk-256 which are associated with the corresponding column block, as shown in FIG. 2b. In series between the bit lines BLk-1 to BLk-256 and nodes 36 are respectively connected drain-to-source paths of D-type transistors 38 and 40. Gates of the D-type transistors 38 are connected to the power supply voltage Vcc to prevent the transfer of high voltages induced on the bit lines BLk-1 to BLk-256 in a block erasing operation. Gates of the D-type transistors 40 are connected to a control signal $\phi_1$ staying at "H" level of about 5 volts during programming. Between the nodes 36 and nodes 42 are respectively connected drain-to-source paths of n-channel transistors 44. Gates of the transistors 44 are connected to a control line SBL staying at "H" level during programming. Between the nodes 42 and nodes 46 are respectively connected latches PBk-1 to PBk-256 constituting the data register which is referred to as a page buffer. Each of the latches is comprised of two inverters cross connected. The latches PBk-1 to PBk-256 serve not only as a page buffer for temporarily storing data so as to simultaneously write the data into memory cells via respective corresponding bit lines in a programming operation, but also as verifying detectors for determining if the program was well performed in a programming verification operation and as sense amplifiers for sensing and amplifying data on bit lines which is read out from memory cells in a reading operation. A tristate inverter 48 and an n-channel transistor 49 are connected in parallel between each of the nodes 42 and its corresponding one of the lines DLk-1 to DLk-256. Each tristate inverter 48, which is referred to as a clocked CMOS inverter, is enabled by a control signal $\phi_4$ at "H" level while becoming high impedance by the signal $\phi_4$ at "L" level. Thus, each of the inverters 48 serves as a buffer amp, being enabled in programming verification and reading operations. N-channel transistors 49 whose gates are connected to a control signal $\phi_5$ are transfer transistors for transferring input data to the corresponding latches PBk-1 to PBk-256 in a programming operation. The tristate inverter 48 which is used in the present embodiment is illustrated as a schematic circuit diagram in FIG. 8a. Between each of nodes 46 and the reference potential are serially connected current paths of n-channel transistors 50 and 52. Gates of the transistors 52 are connected to a control signal $\phi_2$, staying at "H" level during a verification sensing period in a programming verification operation and during a read sensing period in a read operation. Gates of the transistors 50 are respectively connected to the nodes 36, and drain-to-source paths of n-channel transistors 37 are respectively connected between the nodes 36 and the reference potential. Gates of the transistors 37 are connected in common to a line DCB to which a control signal is applied to cause bit lines to be discharged after completion of erasing and programming operations and to reset the data register to "L" state, i.e. "0" data prior to a reading operation.

The data register and sense amplifier 12 includes a constant current source circuit 33, which is referred to as a current mirror, according to the present embodiment. The constant current source circuit 33 comprises a reference portion 64 which is enabled in programming verification and reading operations and disabled in erasing and programming operations; and current source portions 66 comprised of p-channel transistors 54 whose drain-to-source paths are respectively connected between gates of the transistors 50 and the power supply voltage Vcc. The reference portion 64 is comprised of p-channel transistors 56 and 58 and n-channel transistors 60 and 62 to serve as a reference for the current source transistors 54. Source-to-drain paths of the p-channel transistors 56 and 58 are connected in parallel between the power supply voltage Vcc and a line 68, and the gate of the p-channel transistor 58 is connected to the line 68. Drain-to-source paths of the n-channel transistors 60 and 62 are connected in series between the line 68 and the reference potential. The gate of the n-channel transistor 60 is connected to a reference voltage $V_{ref}$ of about 2 volts. Gates of the transistors 56 and 62 are connected to a control signal $\phi_3$, and gates of the current source transistors 54 are connected to the line 68. Thus, in programming verification and reading operations, the current source transistors 54 connected to the reference portion 64 which is enabled by the control signal $\phi_3$ serve to provide a constant current of about 4 µA to bit lines BLk-1 to BLk-256.

A programming determination circuit 24 of FIG. 1 is connected via lines 70 to lines DLk-1 to DLk-256 of FIG. 2b to serve to determine if every programmed memory transistor reaches the range of desired threshold voltages in a programming verification operation.

FIG. 9 shows a schematic circuit diagram of the programming determination circuit 24. It should be noted that the circuitry of FIG. 9a is a portion of the programming determination circuit 24 associated with the k-th column block CBk, and eight circuits corresponding to the respective ones of column blocks present as a peripheral circuit on the on-chip EEPROM. A circuit shown in FIG. 9b is a summation circuit to perform a summation function for providing an "L" level when any one of signals FP1 to FP8 is "L" level. Referring to FIG. 9a, drain-to-source paths of n-channel transistors 212 to 216 are connected in parallel between a line 210 and the reference potential, and gates of the transistors 212 to 216 are respectively connected to lines 70 of FIG. 2b. Current paths of p-channel transistors 218 and D-type transistor 220 are connected in series, and the gate of the transistor 218 is connected to a control signal $\overline{SUP}$ staying at "L" level in a programming verification operation while the gate of the transistor 220 is connected to the line 210. The transistors 212 to 220 constitute a NOR gate 234. Two input terminals of NOR gate 222 are respectively connected to the line 210 and a control signal $\overline{SFP}$ which becomes "L" state only upon a verifying check. The input of an inverter 224 is connected to the output of the NOR gate 222, and the output terminal of the inverter 224 outputs FPk. The summation circuit 236 of FIG. 9b is comprised of NAND gate 226 connected to lines FP1 to FP4; NAND gate 228 connected with signals FP5 to FP8; and NOR gate 230 connected to outputs of the NAND gates 226 and 228.

Referring now to the timing charts of FIG. 10 to FIG. 12, an explanation will be given of operations and features of the first embodiment shown in FIGS. 1 to 9.

Block Erasing Mode

In a block erasing mode, the data register and sense amplifier 12, the column decoder and selection circuit 14, the input/output buffer 16 and the programming determination circuit 24 are all in off states. Explained in more detail, the column decoder 30 of FIG. 2b is reset, thereby rendering transfer transistors T1 to T256 nonconductive. Control signals $\phi_1$ to $\phi_5$ and signals on lines DCB and SBL are held in "L" states, so that the data register and sense amplifier 12 become nonconductive. The control signal $\overline{SUP}$ of FIG. 9a is held in "H" state, and the programming determination circuit 24 is thereby nonconductive. The source line driving circuit 22 provides "L" state, i.e. the reference potential of 0 volts on the common source line CSL by $\overline{PGM}$ staying at "H" level.

Now, an explanation will be given in conjunction with the timing chart of FIG. 10, assuming that simultaneous block erasing is performed on data stored in memory transistors in the memory block BK1.

The time interval between $t_1$ and $t_2$ is a period for discharging all word lines WL1 to WL8 to the reference potential. During this period, NAND gate 124 of FIG. 5 retains "H" level with the control signal $\overline{BLK}$ at "L" level, and D-type transistor 126 is conducting with $\overline{PGM}$ at "H" level. Thus, the block selection control line BSCi stays at "H" level of 5 volts. At this time, the charge pump circuit 128 is in a nonconducting state. Consequently, in this period, all of the block selection control lines BSC1 to BSC1024 maintain the potential of 5 volts. On the other hand, in this period, since control signals $\overline{PVF}$ and $\overline{PGM}$ stay at "H" levels and the control signal $\overline{ERA}$ is at "L" level, the outputs of NAND gate 156 and tristate NAND gates 158 remain at "H" level and "L" level, respectively. At this time, the tristate inverter 164 is in a high impedance state. Thus, the control gate line CGLj stays at "L" level of 0 volts via turned-on D-type transistor 176. Consequently, all of the control gate lines CGL1 to CGL8 maintain "L" level during this period. Transfer transistors BT1 to BT10 are all turned on by the potential of the block selection control lines BSC1 to BSC1024 of 5 volts, and word lines WL1 to WL8 are all discharged to the reference potential.

The time duration between $t_2$ and $t_3$ is a period to erase all memory cells in only a selected memory block. At time $t_2$, the decoder 120 receives address signals Pl, Ql and Rl which are all at "H" levels to select the memory block BK1, and the output of the decoder 120 thereby goes to "L" level. Thus, the output of NAND gate 124 goes to "H" level. Consequently, the block selection control line BSC1 corresponding to the selected memory block BK1 remains at the potential of 5 volts during the period between $t_2$ and $t_3$. However, decoders 120 associated with unselected memory blocks BK2 to BK1024 output "H" levels since at least one of the address signals Pl, Ql and Rl is "L" level. Consequently, block selection control lines BSC2 to BSC1024 associated with the unselected memory blocks go to the reference potential of 0 volts. Thus, transfer transistors in the transfer transistor array 34-1 are all turned on, and word lines WL1 to WL8 in the memory block BK1 thereby go to the reference potential. However, since the transfer transistor arrays 34-2 to 3-1024 connected with unselected memory blocks BK2 to BK1024 are all turned off, word lines associated therewith go to floating states.

At time $t_2$, the erase voltage Vera of about 20 volts is applied to the p-type well region 76 and the n-type well region 74 via the well electrode 114 of FIG. 4. During the time interval between $t_2$ and $t_3$, i.e. during the time period of about 10 msec, floating gates of memory transistors in the selected memory block BK1 accumulate holes by means of the F-N tunneling which is generated by the application of the erase voltage Vera to their channel, source and drain regions and that of the reference potential to their control gates. Thus, all of the memory transistors in the memory block BK1 are changed into D-type transistors having threshold voltages of about −3 volts. That is, all memory transistors in the memory block BK1 are erased to binary zero data.

However, in the case when the erase voltage $V_{era}$ is applied to the p-well and N-well regions 76 and 74 via the well electrode 114 at time $t_2$, since word lines in unselected memory block BK2 to BK1024 are then in floating states, the word lines are thereby charged to substantially the erase voltage Vera by a capacitive coupling. Thus, the charged voltage of the word lines in the unselected memory blocks sufficiently reduces the electric field between the channel region and the control gate of each memory transistor such that its erasure can be prevented. The inventors have discovered that word lines in unselected memory blocks were charged to an amount of 80 to 90 percent of the erase voltage $V_{era}$, and data of programmed memory transistors in the unselected memory blocks was not destroyed or disturbed. Thus, in the block erasing of the present embodiment, since it is unnecessary to apply the program inhibition voltage from a voltage boosting circuit to word lines in unselected memory blocks, a reduction of the area occupied by the chip as well as the prevention of power consumption can effectively be accomplished. Moreover, the present invention has an advantage of increasing effective memory array area whilst reducing peripheral circuit area on a chip surface of a fixed size. This results in increasing the memory capacity of the EEPROM.

In the above-mentioned block erasing operation, the erase voltage applied to the well electrode 114 is coupled as well on the floated word lines as on floated bit lines. Thus, the bit lines are also charged to the erase voltage of about 20 volts in the block erase operation. To prevent voltage-induced stress on transistors 40 of FIG. 2b due to the charged erase voltage, D-type transistors 38, whose gates are connected to the power supply voltage Vcc, are respectively connected between bit lines BLk-1 to BLk-256 and the transistors 40.

During the block erasing operation between $t_2$ and $t_3$, the first selection line SL1 of the selected memory block BK1 maintains a potential of about 4.3 volts, and the second selection line SL2 of the block BK1 is in a floating state since control signals $\phi 6$ and $\phi_7$ are at "L" levels, thereby rendering transistors 140 to 144 of FIG. 5 nonconductive. The floating state of the second selection line SL2 thereof prevents current flowing via the line SL2 from the well electrode 114 when one or some of the second selection transistors ST2 thereof failed. During the block erasing operation, the voltage relationship of significant portions of selected and unselected memory blocks can be summarized in the following TABLE 1.

TABLE I

|  | Voltage States For Selected Memory Block | Voltage States For Unselected Memory Blocks |
| --- | --- | --- |
| First Selection Line SL1 | 4.3V | 0V |
| Word Lines WL1 to WL8 | 0V | Approximately 20V |
| Second Selection Line SL2 | Floating | Floating |
| Well Electrode | 20V | 20V |

Figure 10:
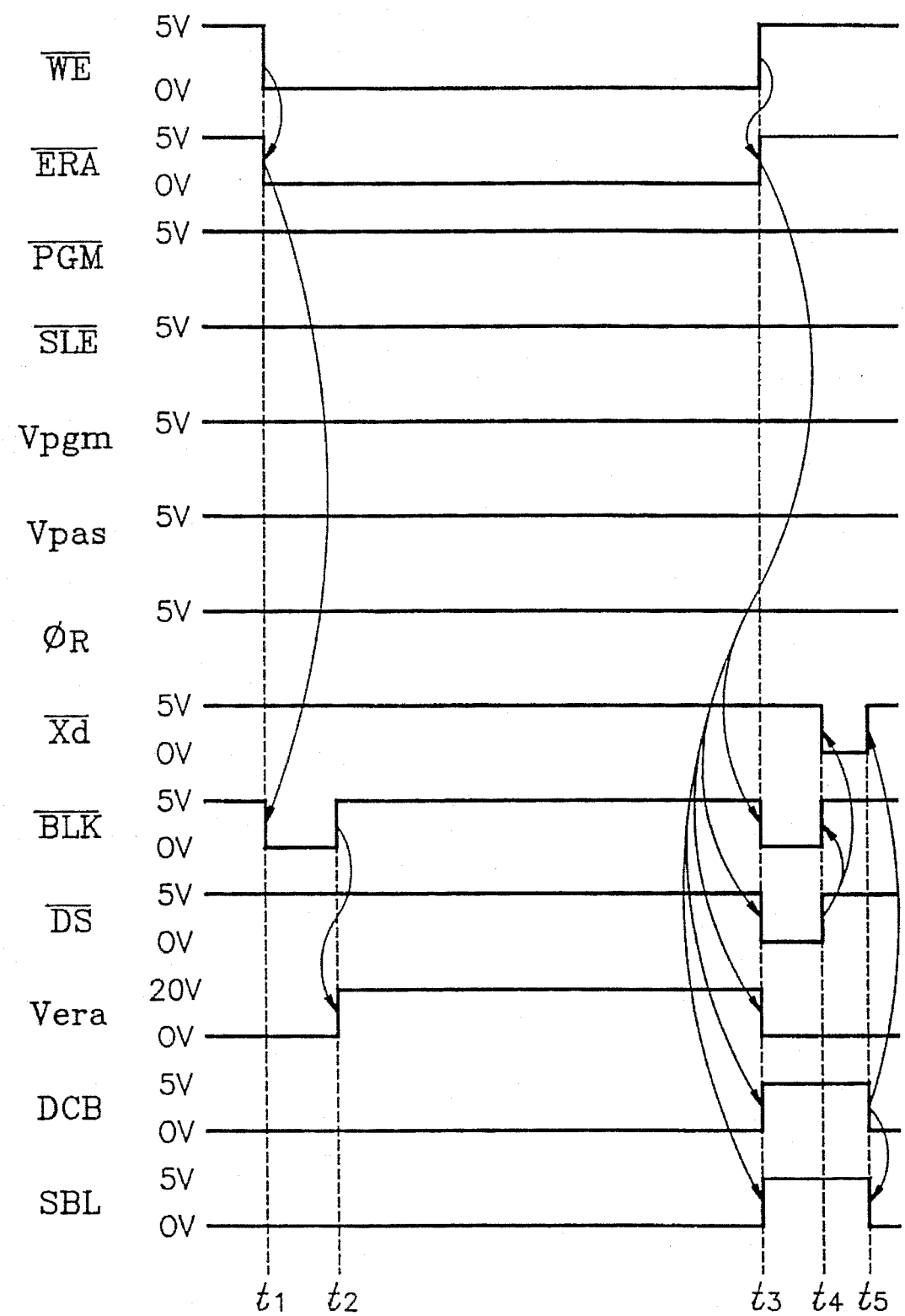
FIG. 10 shows a timing chart of various control signals used in a block erasing mode according to a first embodiment of the present invention.

Turning to FIG. 10, the time duration between $t_3$ and $t_5$ is a period to discharge the charged voltage on bit lines and word lines. At time $t_3$, the block erasing operation terminates and the erase voltage Vera goes to the reference potential while control signals $\overline{WE}$ and $\overline{ERA}$ go to "H" level. Between $t_3$ and $t_4$, the output of NAND gate 156 stays at "H" level with the control signal $\overline{DS}$ at "L" level. Thus, the output of NAND gate 158 goes to "L" level with the control signal $\overline{\text{PGM}}$ at "H" level. Consequently, control gate lines CGL1 to CGL8 maintain "L" levels between $t_3$ and $t_4$. During this period, the output of NAND gate 124 of FIG. 5 stays at "H" level with the control signal $\overline{\text{BLK}}$ at "L" level. Thus, each of the block selection control lines BSC1 to BSC1024 goes to a potential of 5 volts. Consequently, all transfer transistors BT1 to BT10 are turned on, and all word lines WL1 to WL8 are discharged to the reference potential. On the other hand, the first and second selection lines SL1 and SL2 are also discharged to a potential of 5 volts.

At time $t_3$, the line DCB goes to "H" level and $\phi 1$ also goes to "H" level. Thus, the erase voltage charged on bit lines discharges to "L" level via transistors 37 shown in FIG. 2b.

At time $t_4$, control signals $\overline{\text{BLK}}$ and $\overline{\text{DS}}$ go to "H" levels and $\overline{X_d}$ goes to "L" level. Thus, NAND gate 120 of FIG. 5 goes to "H" level, and the first and second gate lines SGLi-1 to SGLi-2 and block selection control lines BSCi go to the reference potential.

Program Mode

The present EEPROM performs a data loading operation to store data input via input/output terminals into data latches PBk-1 to PBk-256 prior to a programming operation after an erasing operation.

Figure 11:
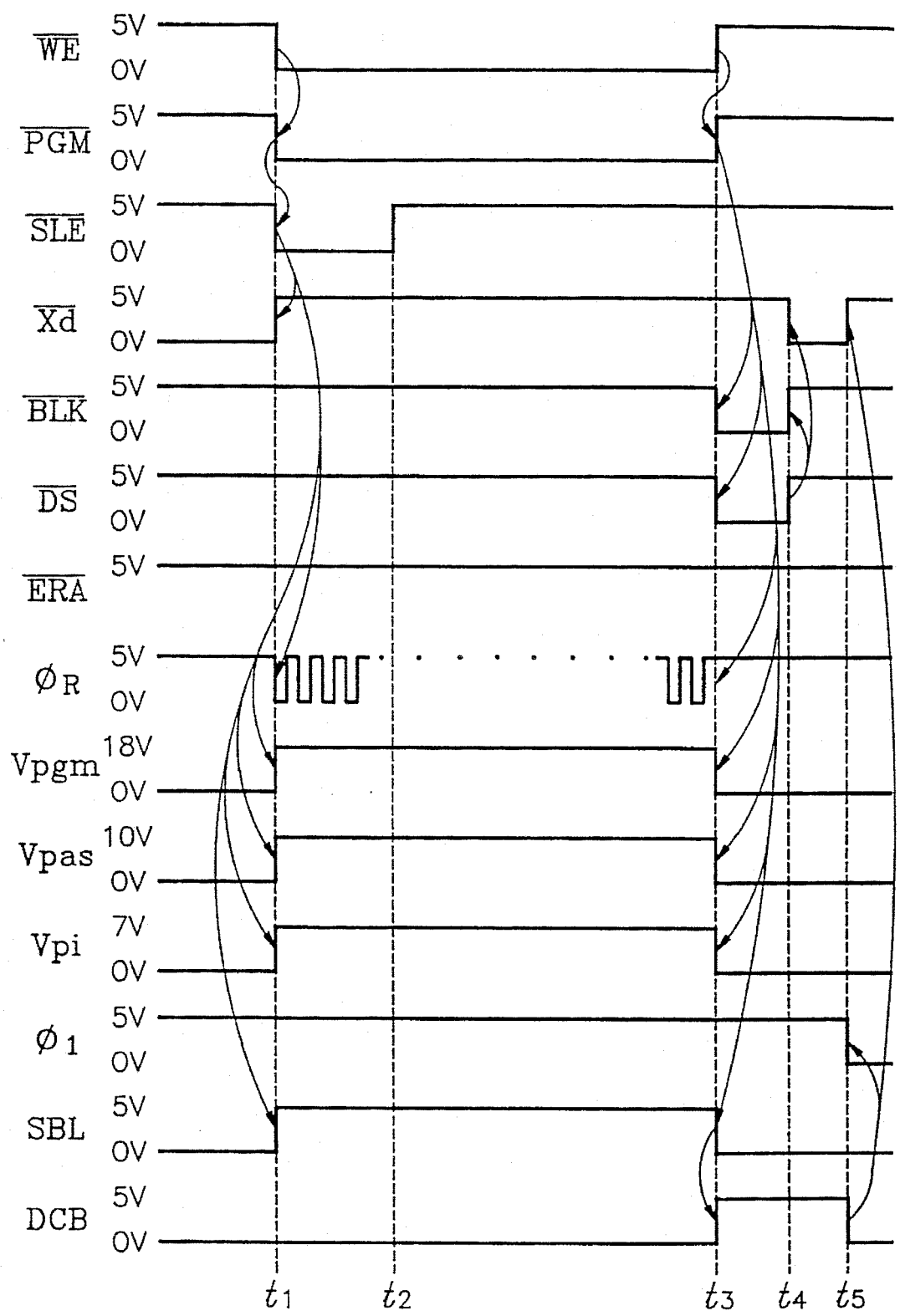
FIG. 11 shows a timing chart of various control signals used in a programming mode according to the first embodiment of the present invention.

Data loading operation is accomplished prior to a time $t_1$ of FIG. 11. During the data loading operation, control signals $\overline{X_d}$, $\phi 2$, $\phi_3$ and $\phi_4$, program voltage $V_{pgm}$, pass voltage $V_{pas}$, p-well region 76, program inhibition voltage $V_{pi}$ and lines SBL and DCB stay at "L" levels, and control signals $\overline{\text{WE}}$, $\overline{\text{PGM}}$, $\overline{\text{SLE}}$, $\overline{\text{BLK}}$, $\overline{\text{DS}}$, $\overline{\text{ERA}}$, $\overline{\text{PVF}}$, $\overline{\text{SUP}}$ $\phi_R$, $\phi_5$ and $\phi_1$ are at "H" levels. As can be seen in FIG. 5, since $\overline{X_d}$ is "L" level and $\overline{\text{BLK}}$, $\overline{\text{ERA}}$, $\overline{\text{SLE}}$, $\overline{\text{WE}}$ and $\overline{\text{PGM}}$ are all "H" levels, block selection gate lines BSC1 to BSC1024 stay at "L" levels, thereby rendering transfer transistor arrays 34-1 to 34-1024 nonconductive. With the line SBL at "L" level, connection of data latches PBk-1 to PBk-256 to bit lines BLk-1 to BLk-256 is inhibited. The constant current circuit 33 and tristate inverters 48 of FIG. 2b are in nonconducting states with signals $\phi_3$ and $\phi_4$ at "L" levels.

Address inputting to external address input terminals is composed of row address $a_8$ to $a_{20}$ and column address $a_0$ to $a_7$. The row address $a_8$ to $a_{20}$ inputs to select one of the memory blocks and one of the word lines during the data loading operation so as to write data on all bit lines into memory cells at one time, i.e. to perform a page program in the programming operation after the completion of the data loading operation. The column address $a_0$ to $a_7$ is address signals having 256 cycles during the data loading operation. The column decoder 30 of FIG. 2b responds to the column address of 256 cycles based on the toggling of external write enable Signal $\overline{\text{WE}_x}$ to render transfer transistors T1 to T256 conductive in sequence. At the same time, input buffer 26 corresponding to the respective column blocks sequentially outputs data input to the corresponding input/output terminal in response to the toggling of $\overline{\text{WE}_x}$. Thus, output data from the respective input buffers 26 is stored in sequence into data latches PBk-1 to PBk-256 via sequentially turned-on transfer transistors T1 to T256 and corresponding transfer transistors 49.

After the above-mentioned data loading operation, the programming operation is started. One characteristic feature of the present embodiment is that the programming operation includes the NAND cell charging operation.

For the convenience of explanation of the programming operation, it is assumed that data stored in the data latches is to be written into memory transistors $M_4$ connected to a word line WL4 in the memory block BK1.

The programming operation is performed during the time period between $t_1$ and $t_3$ as shown in FIG. 11. During this period, p-well region 76, signals $\overline{\text{WE}}$, $\overline{\text{PGM}}$, $\phi_2$, $\phi_3$, $\phi_4$ and $\phi_5$ and the line DCB stay at "L" levels while signals $\overline{X_d}$, $\overline{\text{BLK}}$, $\overline{\text{DS}}$, $\overline{\text{ERA}}$ and $\phi_1$ and the line SBL are all at "H" levels. The clock $\phi_R$, the program voltage $V_{pgm}$ (=18 volts), the pass voltage $V_{pas}$ (=10 volts) and the program inhibition voltage $V_{pi}$ (=7 volts) are supplied during this period. On the other hand, the row address $a_8$ to $a_{20}$, which is inputted during the above-mentioned data loading operation, is latched in the address buffer (not shown). Address signals Pl, Ql and Rl which are generated by predecoding address signals $A_{11}$, $\overline{A_{11}}$ to $A_{20}$, $\overline{A_{20}}$ of the latched address, are input to the decoder 120 of FIG. 5. Address signals $A_8$,$\overline{A_8}$ to $A_{10}$,$\overline{A_{10}}$ of the latched address are input to the decoder 154 of FIG. 6.

At time $t_1$, the control signal $\overline{X_d}$ goes to "H" level, and address signals Pl, Ql and Rl selecting the memory block BK1 are input to the NAND gate 120 of FIG. 5. Then, the output of the gate 120 goes to "L" level, and outputs of NAND gates 124 and 136 go to "H" levels. Thus, the first selection gate line SGL1-1 goes to a potential of 5 volts, and the block selection control line BSC1 is boosted to the program voltage $V_{pgm}$ of 18 volts by the pumping operation of the charge pump circuit 128. On the other hand, the second selection gate line SGL1-2 is boosted to the pass voltage $V_{pas}$ of 10 volts by the pumping operation of the charge pump circuit 152 with "H" level transferred via transfer transistors 140, 142 and 150. Each decoder 120 associated with unselected memory blocks BK2 to BK1024 goes to "H" level, and the output of each NAND gate 124 corresponding thereto goes to "L" level. Thus, unselected block selection control lines BSC2 to BSC1024 go to a reference potential of 0 volts.

At time $t_1$, the program control signal $\overline{\text{PGM}}$ goes to "L" level and the common source line CSL, which is the output line of the source line driving circuit 22 of FIG. 7, is boosted to the program inhibition voltage $V_{pi}$. That is, if $\overline{\text{PGM}}$ goes to "L" level, the common source line CSL goes to the absolute value, for example 2 to 3 volts, of the threshold voltage of D-type transistor 206 and is thereby boosted to the program inhibition voltage $V_{pi}$ by means of the charge pump circuit 208.

As previously mentioned, since address signals $A_8$,$\overline{A_8}$ to $A_{10}$,$\overline{A_{10}}$ selecting the word line WL4 were input to the decoder 154 of FIG. 6 in the previous data loading operation, the output of the decoder 154 associated with CGL4 is at "L" level, and the outputs of the decoders 154 associated with unselected word lines WL1 to WL3 and WL5 to WL8 are at "H" levels. Thus, the output of NAND gate 156 associated with the selected word line WL4 is at "H" level, and the output of NAND gates 156 associated with the unselected word lines are at "L" levels. At time $t_1$, the clock $\phi_R$ is generated. Then, NAND gate 178 and NOR gate 188 associated with the selected word line WL4 respectively output the clock $\phi_R$ and "L" level, thereby providing the program voltage Vpgm on the selected control gate line CGL4. On the contrary, NOR gates 188 associated with unselected word lines output the clock $\phi_R$, thereby providing the pass voltage $V_{pas}$ on unselected control gate lines CGL1 to CGL3 and CGL5 to CGL8.

At time $t_1$, the line SBL goes to "H" level. Thus, transfer transistors of FIG. 2b are all turned on so as to transfer data stored in latches PBk-1 to PBk-256 to corresponding bit lines BLk-1 to BLk-256. All memory transistors of the selected memory block BK1 in the previous block erase mode were erased to "L" levels, i.e. logic "0" data. In the data loading operation after a block erasing mode, latches corresponding to memory transistors which are to write "H" levels, i.e. logic "1" data were stored to "L" level, i.e. logic "0" data while latches corresponding to memory transistors which are to write logic "0" data were stored to logic "1" data. For the convenience of explanation, assume that logic "1" data is written into a memory transistor 240 which is connected to the selected word line WL4 and bit line BL1-2 of memory block BK1 in the first column block CB1 of FIG. 2a while logic "0" data is written into the remaining memory transistors connected to the word line WL4 thereof. Then, the latch PB1-2 has already stored logic "0" data while the remaining latches have already stored logic "1" data in the data loading operation. Thus, after time $t_1$, the conduction of transfer transistors 44 causes the bit line BL1-2 to go to "L" level and the remaining bit lines to go to "H" levels of 5 volts.

Consequently, during the time duration between $t_1$ and $t_2$, the transfer transistor array 34-1 of FIG. 2a is conducting, and the first and second selection lines SL1 and SL2 in the selected memory block BK1 respectively maintain 5 volts and $V_{pas}$ (=10 volts) while the selected word line WL4 and unselected word lines WL1 to WL3 and WL5 to WL8 maintain $V_{pgm}$ (=18 volts) and $V_{pas}$, respectively. During the programming operation, since the common source line CSL maintains the program inhibition voltage $V_{pi}$ (=7 volts), the second selection transistor ST2 and memory transistors M1 to M8 in the block BK1 are all turned on, and the first selection transistor 242 connected to the bit line BL1-2 is turned on while remaining first selection transistors excluding the transistor 242 in the block BK1 are turned off. Thus, current paths of memory transistors in the NAND cell including the memory transistor 240 are connected with the bit line BL1-2, and channels of the memory transistors and the respective junction capacitor of their sources and drains are thereby discharged to a reference potential of 0 volts. However, first selection transistors ST1 associated with memory transistors which are to write logic "0" data are turned off, and channels of memory transistors in the NAND cells associated therewith and the respective junction capacitors of their sources and drains are charged to the program inhibition voltage $V_{pi}$ (=7 volts). Thus, during the time period of about 100 μsec between t1 and t2, a NAND cell charging operation associated with memory transistors which are programmed to logic "0" data is carried out.

Turning to FIG. 11, the time duration between $t_2$ and $t_3$, i.e. the period of about 2 msec, is a period to perform substantial programming. At time $t_2$, the signal $\overline{SLE}$ goes to "H" level and, as can be seen in FIG. 8c, $\phi_6$ goes from "H" level to "L" level while $\phi_7$ goes from "L" level to "H" level. Thus, transistors 144 of FIG. 5 are turned on, thereby causing all of second gate lines SGLi-2 to be connected with the reference potential. Thus, all of second selection transistors ST2 in the selected memory block BK1 are turned off. During this period, the program voltage $V_{pgm}$ of about 18 volts is applied on the word line WL4 in the selected memory block BK1, and source, drain and channel of the memory transistor 240 are applied to 0 volts. Thus, the floating gate of the transistor 240 is accumulated with electrons by the F-N tunneling, thereby causing the transistor 240 to be changed into an enhancement mode transistor having a threshold voltage of about 0.8 volts. However, since junction capacitors of sources and drains of memory transistors excepting the transistor 240 and their channels are charged to the program inhibition voltage $V_{pi}$, injection of electrons into floating gates of these transistors is inhibited and these transistors remain as depletion mode transistors storing logic "0" data. That is, NAND cells associated with memory cells which are programmed to logic "0" data are blocked from connection to corresponding bit lines by the above-mentioned NAND cell charging, thereby being prevented from writing.

As discussed above, the voltage relationship of significant portions during the NAND cell charging and the programming operation can be summarized in the following TABLE 2.

TABLE 2

|  | Voltage States During NAND Cell Charging Period | Voltage States During Programming Period |
|---|---|---|
| First Selection Line SL1 Of Selected Memory Block | 5V | 5V |
| Unselected Word Lines Of Selected Memory Block | $V_{pas}$ = 10V | $V_{pas}$ = 10V |
| Selected Word Line Of Selected Memory Block | $V_{pgm}$ = 18V | $V_{pgm}$ = 18V |
| Second Selection Line SL2 Of Selected Memory Block | $V_{pas}$ = 10V | 0V |
| Common Source Line CSL | $V_{pi}$ = 7V | $V_{pi}$ = 7V |
| Well Electrode | 0V | 0V |

The time period between $t_3$ and $t_5$, i.e. the period of 500 nsec, is a period to discharge the boosted voltage on the bit lines and the word lines. At time $t_3$, control signals $\overline{WE}$ and $\overline{PGM}$ and the line DCB go to "H" levels, and control signals $\overline{BLK}$ and $\overline{DS}$, voltages $V_{pgm}$, $V_{pas}$ and $V_{pi}$ and the line SBL go to "L" levels of 0 volts. The clock $\phi_R$ stops pulsing to be fixed at "H" level at the time $t_3$. On the other hand, during this period, $\phi_1$ maintains "H" level and $\phi_2$ and $\phi_3$ maintain "L" levels. Thus, the source line driving circuit 22 outputs the reference potential on the common source line CSL. Control gate lines CGL1 to CGL8 of FIG. 6 go to a potential of 0 volts, and block selection control lines BSC1 to BSC1024 of FIG. 5 go to a potential of 5 volts. This results in causing all word lines to be discharged to the reference potential. At time $t_4$, $\overline{Xd}$ goes to "L" level and $\overline{BLK}$ and $\overline{DS}$ go to "H" levels. Thus, during the time period between $t_4$ and $t_5$, block selection control lines BSCi and first and second selection gate lines SGLi-1 and SGLi-2 go to the reference potential. On the other hand, since the line DCB and the signal $\phi_1$ are at "H" levels during the time period between $t_3$ and $t_5$, the boosted voltages on the bit lines are discharged to the reference potential via transistors 37. At time $t_5$, the signal $\phi_1$ goes to "L" level.

Programming Verification Mode

The programming verification mode is performed immediately after the programming mode. The programing verification operation of the present invention is similar to the reading operation as will be discussed later. The difference as compared with the reading operation is that the voltage applied to a selected word line is a minimum threshold voltage which is to be written into memory transistors. This minimum threshold voltage will be referred to as a programming verification voltage. It is assumed that the programming verification voltage is 0.8 volts in the present embodiment.

Figure 12:
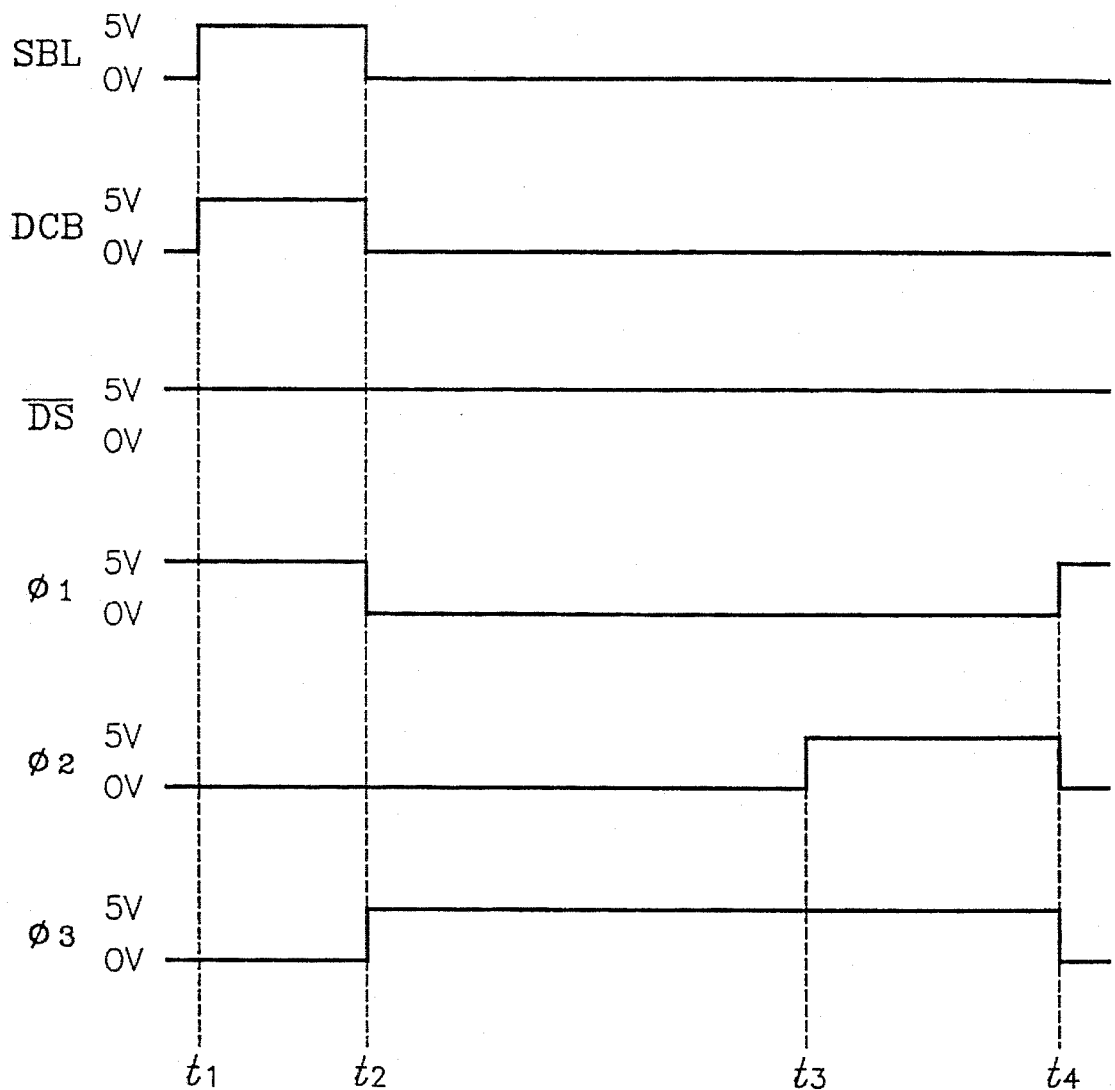
FIG. 12 shows a timing chart of various control signals used in a programming verification mode and a reading mode according to the first and modified embodiments of the present invention.

The programming verification operation is carried out immediately after time $t_5$ in FIG. 11, and a timing chart of the programming verification operation is of the time period between $t_2$ and $t_4$ as shown in FIG. 12. At the initiation of the programming verification, i.e. at time $t_5$ of FIG. 11 or time $t_2$ of FIG. 12, control signals $\overline{Xd}$, $\phi_3$ and $\phi_4$ go to "H" levels and signals $\phi_1$, $\overline{PVF}$ and $\overline{SUP}$ and the line DCB go to "L" levels. Thus, during the programming verification operation, control signals $\overline{WE}$, $\overline{PGM}$, $\overline{SLE}$, $\overline{Xd}$, $\overline{BLK}$, $\overline{DS}$, $\overline{ERA}$, $\phi_3$ and $\phi_4$ and the clock $\phi_R$ maintain "H" levels, and voltages $V_{pgm}$, $V_{pas}$, and $V_{pi}$, lines SBL and DCB and control signals $\phi_1$, $\phi_5$, $\overline{PVF}$ and $\overline{SUP}$ maintain "L" levels.

It is now assumed that the programming verification operation is performed to determine if a memory transistor 240 of FIG. 2a which was written to a logic "1" data in the previous programming mode was programmed with a desired minimum threshold voltage.

Where a command for executing a programming verification after completion of programming operation is input to EEPROM from the microprocessor via input/output terminals or other terminals or where a programming verification operation is automatically carried out after a programming operation, data stored into latches PBk-1 to PBk-256 in the programming operation is succeeded without reset by the programming verification operation. Thus, at the beginning of the programming verification operation, the latch PB1-2 is storing logic "0" data and the remaining latches are storing logic "1" data.

At time $t_2$ of FIG. 12, the control signal $\overline{Xd}$ goes to "H" level and the decoder 120 of FIG. 5 then outputs "L" level in response to address signals Pl, Ql and Rl designating the memory block BK1. Then, since $\phi_6$ and $\phi_7$ respectively maintain "H" level and "L" level, first and second selection lines SGLi-1 and SGL1-2 and the block selection control line BSC1 go to "H" levels of 5 volts.

At time $t_2$, the control signal $\overline{PVF}$ goes to "L" level and address signals $A_8/\overline{A_8}$ to $A_{10}/\overline{A_{10}}$ designating the word line WL4 are fed to the decoder 154 of FIG. 6. Then, NAND gate 158 becomes of high impedance and the verifying voltage generator 164 provides the verifying voltage of 0.8 volts on the control gate line CGL4. However, each decoder 154 associated with unselected word lines WL1 to WL3 and WL5 to WL8 output "H" levels. Then, the verifying voltage generator 164 becomes high impedance and NAND gate 158 outputs "H" level. Thus, control gate lines CGL1 to CGL3 and CGL5 to CGL8 go to "H" level of 5 volts. On the other hand, since $\overline{PGM}$ maintains "H" level at $t_2$, the source line driving circuit 22 of FIG. 7 provides the reference potential on the common selection line CSL.

Consequently, the transfer transistor array 34-1 of FIG. 2a is conductive and the first and second selection lines SL1 and SL2 and unselected word lines WL1 to WL3 and WL5 to WL8 go to the potential of 5 volts while the selected word line WL4 goes to the potential of 0.8 volts. Thus, transistors connected with the selection lines SL1 and SL2 and the unselected word lines are turned on.

At time $t_2$, the control signal $\phi_3$ goes to "H" level, thereby causing the constant current circuit 33 of FIG. 2b to be enabled. Thus, the constant current transistors 54 supply constant current of about 4 µA to bit lines via connecting nodes 36 and transistors 40 and 38.

Assume that the programmed memory transistor 240 has failed to program, i.e. the threshold voltage of the transistor 240 was below the program verifying voltage of 0.8 volts. Then, the transistor 240 is turned on and the bit line BL1-2 connected thereto goes to the reference potential of 0 volts. Since all transistors of NAND cells in the memory block BK1 which are connected with bit lines excluding the bit line BL1-2 are turned on, the bit lines also go to the reference potential. The period of time when word lines WL1 to WL8 and bit lines are established to the predetermined voltages in such a manner is a period of about 2 µsec between $t_2$ and $t_3$ of FIG. 12.

The time period between $t_3$ and $t_4$ of FIG. 12, i.e. the period of about 500 nsec, is for verification sensing. The control signal $\phi_2$ goes to "H" level at time $t_3$, and transistors 52 of FIG. 2b are thereby turned on. The transistor 50 whose gate is connected with the bit line BL1-2 via transistors 38 and 40 is turned off by the reference potential on the bit line BL1-2, thereby causing the latch PB1-2 to maintain logic "0" data. Similarly, since other bit lines are also at the reference potential, transistors 50 associated with these bit lines are turned off and latches excepting the latch PB1-2 thereby maintain previously stored logic "1" data. Verification sensing data stored in the latches PBk-1 to PBk-256 by the above-mentioned verification sensing operation is connected to gates of transistors 212 to 216 of FIG. 9a via turned-on inverters 48 and lines 70. Thus, the "L" level verification sensing data stored in the latch PB1-2 is supplied via corresponding inverter 48 to the gate of transistor 214 which constitutes NOR gate 234 of FIG. 9a associated with the first column block CB1, thereby rendering the transistor 214 conductive and causing the line 210 to be discharged to the reference potential. Consequently, since the signal $\overline{SFP}$ goes to "L" level only when the programming verification is checked, FP1 goes to "L" level. However, since latches in other column blocks CB2 to CB8 store "H" levels, transistors 212 to 216 of NOR gate 234 corresponding to each one of the blocks CB2 to CB8 are in nonconductive states. Thus, each line 210 maintains "H" level by means of pull-up transistors 218 and 220 and FP2 to FP8 thereby stay at "H" levels. Thus, the output line 232 of the summation circuit 236 of FIG. 9b goes from "H" level to "L" level. This represents that the memory transistor 240 was undesirably programmed. That is, it is checked that the threshold voltage of the memory transistor 240 did not reach at a preset minimum threshold voltage. A program determination signal PDS on the line 232 is connected to a timing circuit (not shown) which generates timing signals between $t_1$ and $t_5$ as shown in FIG. 11 so as to perform a reprogramming in response to the signal PDS being at "L" level. That is, reprogramming operation is automatically performed. It would be noted that the reprogramming operation of the present embodiment may automatically be performed by the internal circuit of the present EEPROM without request of either reprogramming control or reloading of data from a microprocessor. However, if necessary, the microprocessor may control the reprogramming operation in response to the signal PDS from one of the input/output terminals of the present EEPROM chip.

Assuming that the memory transistor 240 reached the desired threshold voltage of 0.8 volts by the reprogramming operation, then the transistor 240 is in a nonconductive state during the programming verification operation performed after the reprogramming operation. Thus, the bit line BL1-2 is charged to the potential of about 2 to 3 volts by the constant current supplied via the constant current transistor 54, thereby rendering conductive the transistor 50 connected with the bit line BL1-2. Consequently, the verification sensing data of latch PB1-2 is changed from logic "0" data to logic "1" data. As previously discussed, other latches are storing logic "1" verification sensing data. Thus, all of the latches PBk-1 to PBk-256 store logic "1" verification sensing data. That is, if all memory transistors were well programmed in the page programming operation, verification sensing data stored in the latches is changed into logic "1". Then, transistors 212 to 216 constituting NOR gates 234 of FIG. 9a are all turned off, and signals FP1 to FP8 go to "H" levels with the signal SFP at "L" level during the check of programming verification. Consequently, the summation circuit 236 of FIG. 9b outputs the program determination signal PDS, which is at "H" level. This represents that the programming operation had successfully been performed.

Now assume that some of memory transistors programmed with logic "1" had successfully been programmed and the remainder had unsuccessfully been programmed. Then, during the followed programming verification operation, latches corresponding to the former memory transistors are changed so as to store logic "1" data, while latches corresponding to the latter memory transistors maintain logic "0" data. Since latches in the former case are storing logic "1" data, their corresponding bit lines are charged to the potential of 5 volts during the followed reprogramming operation. However, in the same manner as the above-mentioned programming operation, since, in the reprogramming operation, a selected first selection line stays at 5 volts and junctions of sources and drains of memory transistors and their channels are charged to the program inhibition voltage of 7 volts, first transistors connected with the charged bit lines on the selected first selection line are in nonconductive states. Thus, during the reprogramming operation, the successfully programmed memory transistors are prevented from programming by the charged program inhibition voltages. However, in the case of the latter, i.e. the unsuccessfully programmed memory transistors, since their corresponding latches are storing logic "0" data, reprogramming is performed only on them. With such repeating operations, if all memory transistors on a selected word line which are programmed with logic "1" data were successfully programmed, the program determination signal PDS outputs "H" level during the above-mentioned programming verification operation, and the reprogramming operation is terminated. The present circuit used in the above-mentioned programming verification operation may also be applied to EEPROMs with NOR-type memory arrays.

The programming verification techniques as discussed above have various advantages as follows. First, the programming verification operation can automatically carried out by the internal circuit without the control of an external microprocessor. Second, since the data register is used as data latches in a data loading mode, verification sensing circuits in a programming verification mode and sense amplifiers in a reading mode, as will be discussed hereinbelow, simplification of peripheral circuits may be accomplished. Third, the threshold voltages of programmed memory transistors may be tightly distributed within a narrow range above a preset minimum threshold voltage, and over-programming may be prevented. The tight distribution of threshold voltages can be accomplished by the execution of the programming operation within a shorter period, since successfully programmed memory transistors are automatically inhibited from programming due to the changed data of their corresponding latches.

Reading Mode

FIG. 12 illustrates a timing chart of the reading operation according to the present embodiment.

The time period between t1 and t2 in the drawing is a period to discharge word lines WL1 to WL8 and all bit lines BLk-1 to BLk-256 to the reference potential and to reset so that latches PBk-1 to PBk-256 stores logic "0" data. During this period, the control signal $\phi_1$ and lines SBL and DCB stay at "H" levels. Thus, bit lines BLk-1 to BLk-256 are discharged to the reference potential via the transistor 37 of FIG. 2b, and latches PBk-1 to PBk-256 are reset to logic "0" data by the conduction of transistors 37 and 44. During the time period between $t_1$ and $t_2$, a timing chart of control signals $\overline{WE}$, $\overline{PGM}$, $\overline{SLE}$, $\overline{Xd}$, $\overline{BLK}$, $\overline{DS}$ and $\overline{ERA}$, the clock $\phi_R$ and voltages $V_{pgm}$, $V_{pas}$ and $V_{pi}$ is identical to the timing chart between $t_3$ and $t_5$ shown in FIG. 11. Control signals $\overline{PVF}$ and $\overline{SUP}$ keep "H" levels during operations excepting the programming verification operation.

The time period between $t_2$ and $t_4$ is a period for sensing data read out from memory cells and storing the sensing data into latches PBk-1 to PBk-256. During the period, $\overline{WE}$, $\overline{PGM}$, $\overline{SLE}$, $\overline{Xd}$, $\overline{BLK}$, $\overline{DS}$, $\overline{ERA}$, $\phi_3$, $\phi_4$ and $\phi_R$ maintain "H" levels, and $V_{pgm}$, $V_{pas}$, $V_{pi}$, lines SBL and DCB, $\phi_1$ and $\phi_5$ keep "L" levels.

An explanation will now be given, assuming that a reading operation is performed from memory transistors connected to the word line WL4 in the memory block BK1 which was page programmed in the above-mentioned programming mode.

Operation between $t_2$ and $t_3$ is performed in a similar manner as the verification operation as discussed above. Thus, an explanation will be given in brief. The block selection circuit of FIG. 5 associated with the selected memory block BK1 makes first and second selection gate lines SGL1-1 and SGL1-2 and the block selection control lines BSC1 held at 5 volts in response to address signals Pl, Ql and Rl addressing the block BK1. Since the control signal $\overline{PVF}$ is at "H" level, the verifying voltage generator 164 of FIG. 6 is in a high impedance state and the NAND gate 158 is being enabled. Thus, the control gate line CGL4 corresponding to the selected word line WL4 is at the reference potential of 0 volts in response to address signals $A_8/\overline{A_8}$ to $A_{10}/\overline{A_{10}}$ designating the word line WL4. However, control gate lines CGL1 to CGL3 and CGL5 to CGL8 corresponding to unselected word lines WL1 to WL3 and WL5 to WL8 are at "H" levels of 5 volts. On the other hand, the source line driving circuit 22 of FIG. 7 outputs the reference potential on the common source line CSL. Consequently, the transfer transistor array 34-1 of FIG. 2a is conductive, and first and second selection lines SL1 and SL2 and unselected word lines WL1 to WL3 and WL5 to WL8 in the block BK1 are thereby at 5 volts while the selected word line WL4 therein is at 0 volts.

The control signal $\phi_3$ goes to "H" levels at time $t_2$, thereby causing the current source circuit 33 to be enabled. Thus, the constant current transistors 54 supply the current of about 4μA onto bit lines BLk-1 to BLk-256 via connecting nodes 36 and transistors 40 and 38. Since only the memory transistor 240 is programmed with logic "1" the bit line BL1-2 is charged to about 2 to 3 volts and the remaining bit lines go to 0 volts. At time $t_3$ of FIG. 12, the control signal $\phi_2$ goes to "H" level, thereby rendering transistors 52 of FIG. 2b conductive. Then, only the transistor 50 associated with the bit line BL1-2 is turned on, thereby making the latch PB1-2 sense and store the logic "1". However, remaining latches continuously store logic "0" based on the previously mentioned reset operation since transistors 50 are turned off. That is, page reading is accomplished. Data stored in the latches PBk-1 to PBk-256 is output to input/output terminals I/O1 to I/O8 by a byte (8 bits) via inverters 48, transfer transistors T1 to T256 turned on in sequence in response to column address of 256 cycles and toggles of $\overline{WE_x}$, and output buffer 28.

Modified Embodiments

The EEPROM of the first embodiment explained in connection with FIG. 1 to FIG. 12 comprises the memory array including 1024 memory blocks each of which has NAND cells arranged in the same rows, and a source line driving circuit for generating the program inhibition voltage prior to the programming or reprogramming operation in order to charge it to the NAND cells. However, it should be noted that the present invention is not limited to such an embodiment. For example, the memory array used in other embodiments of the present invention may be comprised of memory blocks having shared word lines as discussed hereinafter. To charge the program inhibition voltage to NAND cell, a capacitive coupling way from control gates may be applied with no use of the source line driving circuit. This modified embodiment is illustrated in FIG. 13 to FIG. 17.

Figure 13A:
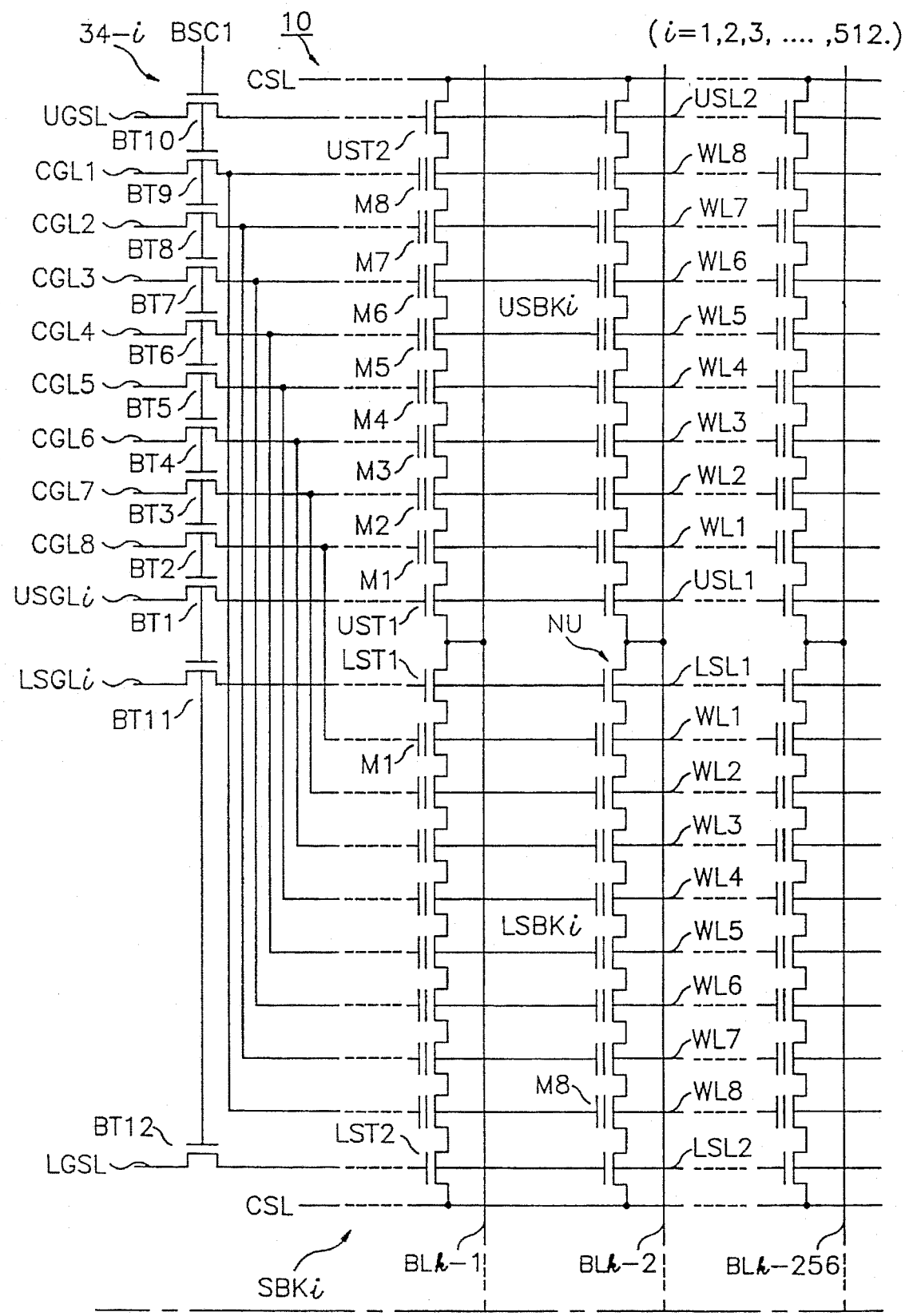
FIG. 13a is a circuit diagram illustrating an arrangement of memory transistors within an i-th memory block having shared word lines in the k-th column block.

FIG. 13 consists of FIG. 13a and FIG. 2b. FIG. 13a shows a memory array composed of memory blocks having shared word lines, and FIG. 2b shows the already discussed peripheral circuit connected with the memory array of FIG. 13a.

For simplification of the drawing, FIG. 13a shows only the arrangement of memory cells and shared word lines which are associated with the k-th column block in the i-th memory block SBKi. However, it should be noted that a memory array 10 having memory cells of 16 mega bits as shown in FIG. 13a is arranged in the same manner as the memory array of FIG. 2a excepting the shared word lines.

Referring to FIG. 13a, each of memory blocks SBKi (i=1, 2, 3, ..., 512) is comprised of two submemory blocks, i.e. an upper memory block or a first submemory block USBKi and a lower memory block or a second submemory block LSBKi. Each of the upper and lower memory blocks USBKi and LSBKi has the same configuration as each of the memory blocks of FIG. 2a. Word lines WL1 to WL8 in the upper memory block USBKi are correspondingly connected with word lines WL1 to WL8 in the lower memory block LSBKi. That is, the upper memory block USBKi shares the word lines WL1 to WL8 with the lower memory block LSBKi.

The word lines WL1 to WL8 are respectively connected to control gate lines CGL1 to CGL8 via current paths of transfer transistors BT2 to BT9. A first upper selection line USL1 and a first lower selection line LSL1 are connected to upper and lower selection gate lines USGLi and LSGLi via current paths of transfer transistors BT1 and BT11, respectively. Second upper and second lower selection lines USL2 and LSL2 are connected to upper and lower ground selection lines UGSL and LGSL via current paths of transfer transistors BT10 and BT12, respectively. Sources of second upper and lower selection transistors UST2 and LST2 are connected to a common source line CSL which is connected to the reference potential, i.e. the ground. Drains of first upper and lower selection transistors UST1 and LST1 are respectively connected to corresponding bit lines.

The control gate lines CGL1 to CGL8 are connected to the control gate driving circuit 20 explained in connection with FIG. 6. Upper and lower selection gate lines USGLi and LSGLi are respectively connected to corresponding block selection control circuits 318 of FIG. 14. Each of the block selection control circuits 318 serves to select one of upper and lower memory blocks in a selected memory block designated by address according to respective operation modes. It should be noted that the block selection control circuits 318 corresponding to the respective memory blocks SBKi are provided on the substrate of the on-chip EEPROM. Thus, it would be appreciated that two memory blocks substantially share one block selection control circuit since each block selection control circuit controls one memory block comprised of upper and lower memory blocks. This results in relatively increasing the area of memory array on the chip substrate of fixed size so as to increase the memory storage capacity since the chip occupying area of the peripheral circuit is decreased.

Figure 15:
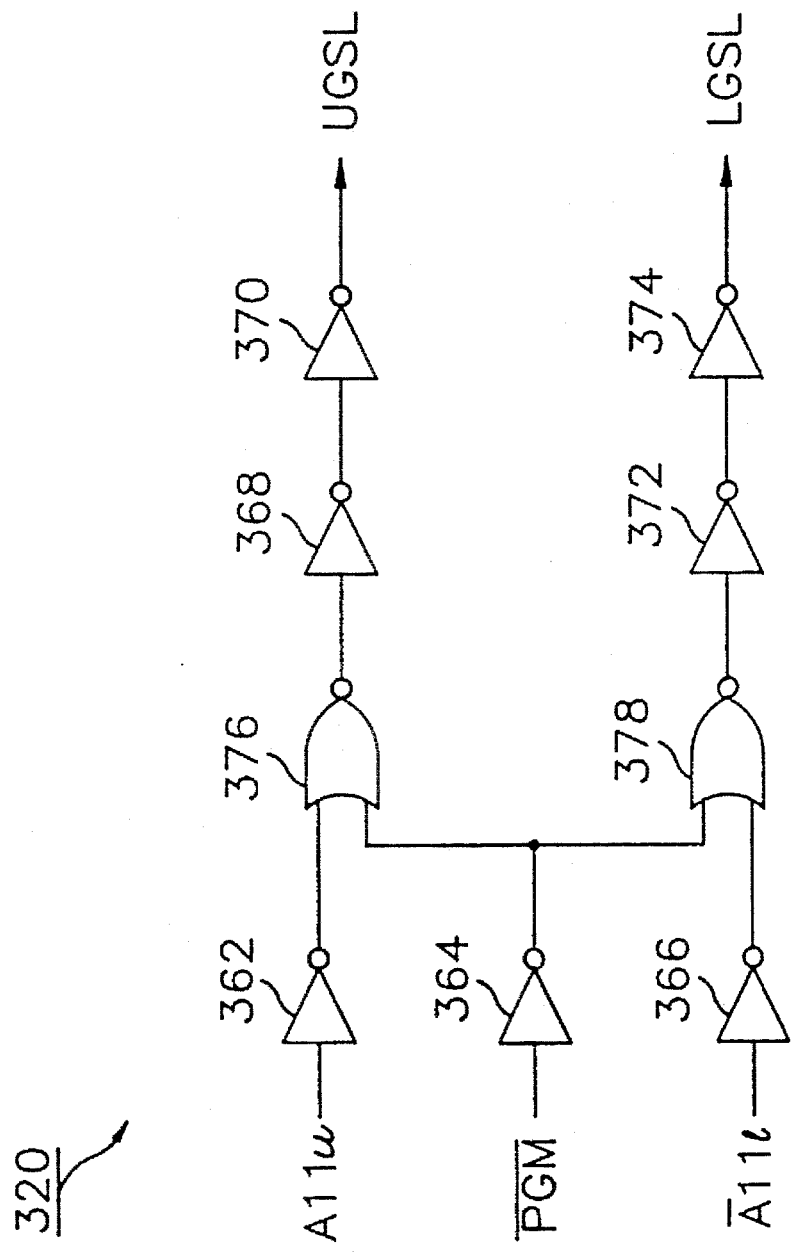
FIG. 15 shows a schematic circuit diagram of a ground line driving circuit associated with the modified embodiment of FIG. 13.

The upper ground selection line UGSL and the lower ground selection line LGSL are connected to a ground line driving circuit 320 illustrated in FIG. 15. The ground line driving circuit 320 is a circuit connected in common with upper ground selection lines UGSL and lower ground selection lines LGSL in memory block SBKi. The ground line driving circuit 320 serves to provide proper voltages onto the upper and lower ground selection lines UGSL and LGSL according to the respective operation modes.

Figure 14:
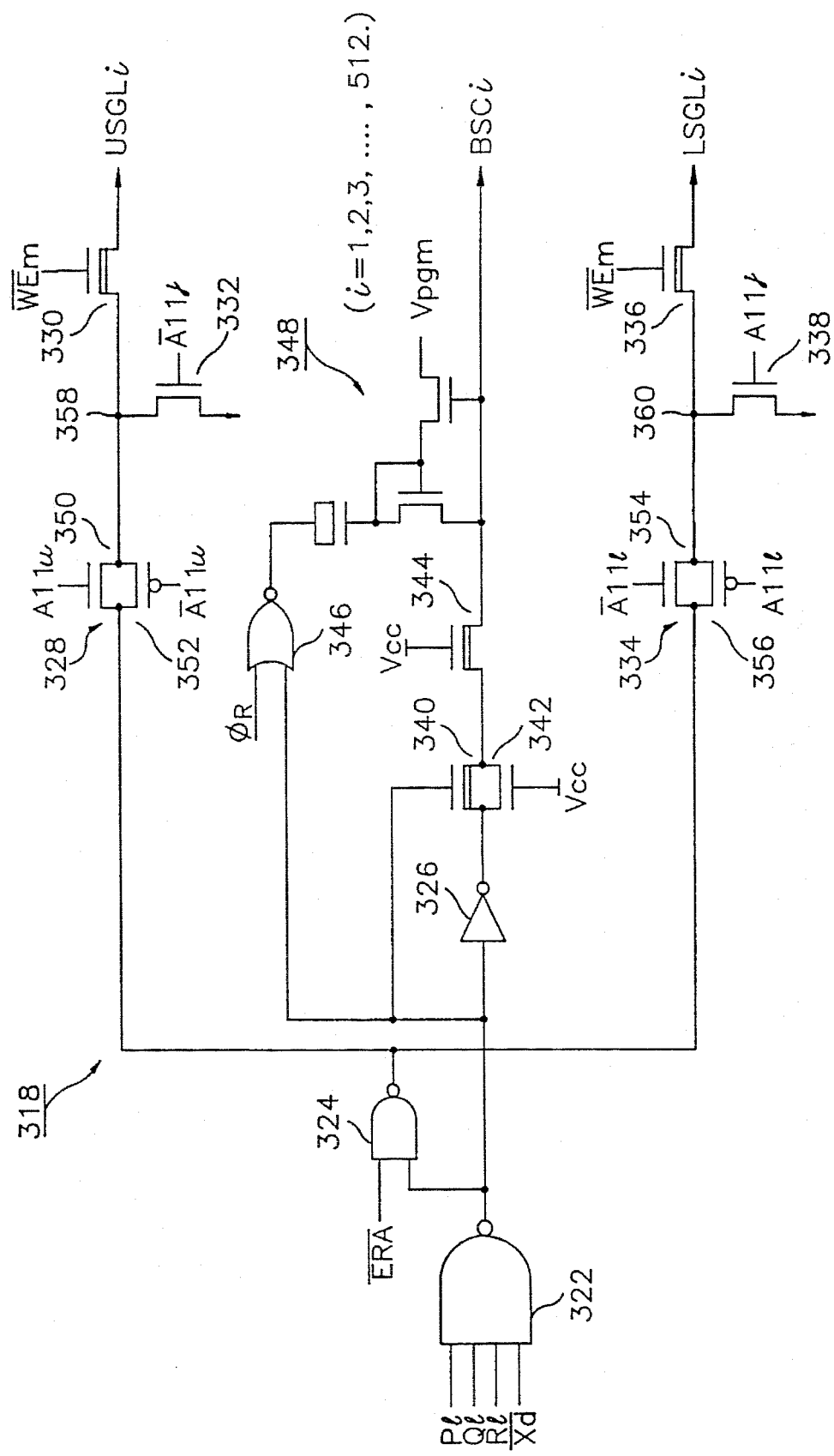
FIG. 14 shows a schematic circuit diagram of a block selection control circuit associated with the modified embodiment of FIG. 13.

Referring to FIG. 14 showing the block selection control circuit which controls the i-th memory block SBKi, a decoder 322 receives address signals Pl, Ql and Rl and the control signal $\overline{Xd}$. The address signals Pl, Ql and Rl are signals predecoded by address signals $A_{12}/\overline{A_{12}}$ to $A_{20}/\overline{A_{20}}$ of row address signals $A_{11}/\overline{A_{11}}$ to $A_{20}/\overline{A_{20}}$ from address buffer (not shown). The row address signal $A_{11}/\overline{A_{11}}$ is input to a timing circuit (not shown) in order to generate control signals $A_{11u}$, $\overline{A_{11u}}$, $A_{11j}$, $\overline{A_{11j}}$ and $A_{11l}$, $\overline{A_{11l}}$ for selecting one of either the upper memory block USBKi or the lower memory block LSBKi according to the respective operation modes. Logic states of these control signals according to the respective operation modes are given in the following TABLE 3 wherein "H" represents "H" level of 5 volts and "L" represents "L" level of 0 volts.

TABLE 3

| | Upper Memory Block Selection $A_{11}$ = H | | Lower Memory Block Selection $A_{11}$ = L | |
|---|---|---|---|---|
| | Erasing Mode | Reading, Programming And Programming Verification Mode | Erasing Mode | Reading, Programming And Programming Verification Mode |
| $A_{11u}$ | H | H | H | L |
| $\overline{A_{11u}}$ | L | L | L | H |
| $A_{11j}$ | L | H | L | L |
| $\overline{A_{11j}}$ | L | L | L | H |
| $A_{11l}$ | L | H | L | L |
| $\overline{A_{11l}}$ | H | L | H | H |

The output of the decoder 322 is connected to one input terminal of NAND gate 324 and an input terminal of an inverter 326. The other input terminal of NAND gate 324 is connected to the erase control signal $\overline{ERA}$. The output of the NAND gate 324 is connected to the upper selection gate line USGLi via a CMOS transfer gate 328, which consists of n-channel transistor 350 and p-channel transistor 352, and the current path of D-type transistor 330. Between a connecting node 358 and the reference potential is connected the current path of n-channel transistor 332. Gates of N-channel transistors 350 and 332, p-channel transistor 352 and D-type transistor 330 are connected to control signals $A_{11u}$, $\overline{A_{11j}}$, $\overline{A_{11u}}$ and $\overline{WE_m}$, respectively. The control signal $\overline{WE_m}$ is at "L" level during the block erasing operation and is at "H" level during remaining operations. The output of the NAND gate 324 is also connected to the lower selection gate line LSGLi via a CMOS transfer gate 334, which consists of n-channel transistor 354 and p-channel transistor 356, and the current path of D-type transistor 336. The current path of n-channel transistor 338 is connected between a connecting node 360 and the reference potential. Gates of n-channel transistors 354 and 338, p-channel transistor 356 and D-type transistor 336 are connected to control signals $\overline{A_{11l}}$, $A_{11j}$, $A_{11l}$ and $\overline{WE_m}$, respectively. The output of the inverter 326 is connected to the block selection control line BSCi via current paths of D-type transistor 340 and n-channel transistor 342, which are connected in parallel, and the current path of D-type transistor 344. The gate of the D-type transistor 340 is connected to the output of the decoder 322, and gates of the n-channel transistor 342 and the D-type transistor 344 are connected to the power supply potential Vcc of 5 volts. Two input terminals of NOR gate 346 are connected to the clock $\phi_R$ and the output of the decoder 322, respectively. Between the output of the NOR gate 346 and the line BSCi is connected a charge pump circuit 348.

If address signals selecting the memory block SBKi input to the block selection control circuit 318, the block selection control line BSCi is at a potential of about 4.3 volts in erasing, programming verification and reading modes, and is at the program voltage $V_{pgm}$ of 18 volts in a programming mode. On the contrary, the block selection control line of respective ones of block selection control circuits associated with unselected memory blocks is at the reference potential of 0 volts in all modes.

If the memory block SBKi is designated by the address signal and the address signal $A_{11}$ is at "H" level, the upper selection gate line USGLi is at a potential of 5 volts in a programming, a programming verification and a reading modes, and the lower selection gate line LSGLi is at a potential of 0 volts by conduction of the transistor 338 in said modes. Similarly, if the memory block SBKi is addressed by the address signal and the address signal $A_{11}$ is at "L" level, the lower selection gate line LSGLi is at a potential of 5 volts in programming, programming verification and reading modes, and the upper selection gate line USGLi is at a potential of 0 volts by conduction of the transistor 332 in said modes. On the other hand, upper and lower selection gate lines USGLi and LSGLi are both in floating states of about 2 to 3 volts in a block erasing mode.

Referring to FIG. 15, the ground line driving circuit 320 is comprised of inverters 362 to 374 and NOR gates 376 and 378. The driving circuit 320 outputs 0 volts onto upper and lower ground selection lines UGSL and LGSL in a programming mode. If the upper memory block is selected in reading and programming verification modes, the upper ground selection line UGSL goes to "H" level of 5 volts, and the lower ground selection line LGSL goes to "L" level of 0 volts. However, if the lower memory block is selected in reading and programming verification modes, the lower ground selection line LGSL goes to "H" level of 5 volts, and the upper ground selection line UGSL goes to "L" levels of 0 volts. On the other hand, upper and lower ground selection lines UGSL and LGSL go to "H" levels of 5 volts in a block erasing mode.

Operations of the modified embodiment are almost the same as those of the first embodiment, excepting operation to select either upper or lower memory block and operation to charge NAND cells by way of a capacitive coupling technique in a programming operation. Thus, a brief explanation of operation of the modified embodiment will be given, referring to the accompanying timing charts.

Figure 16:
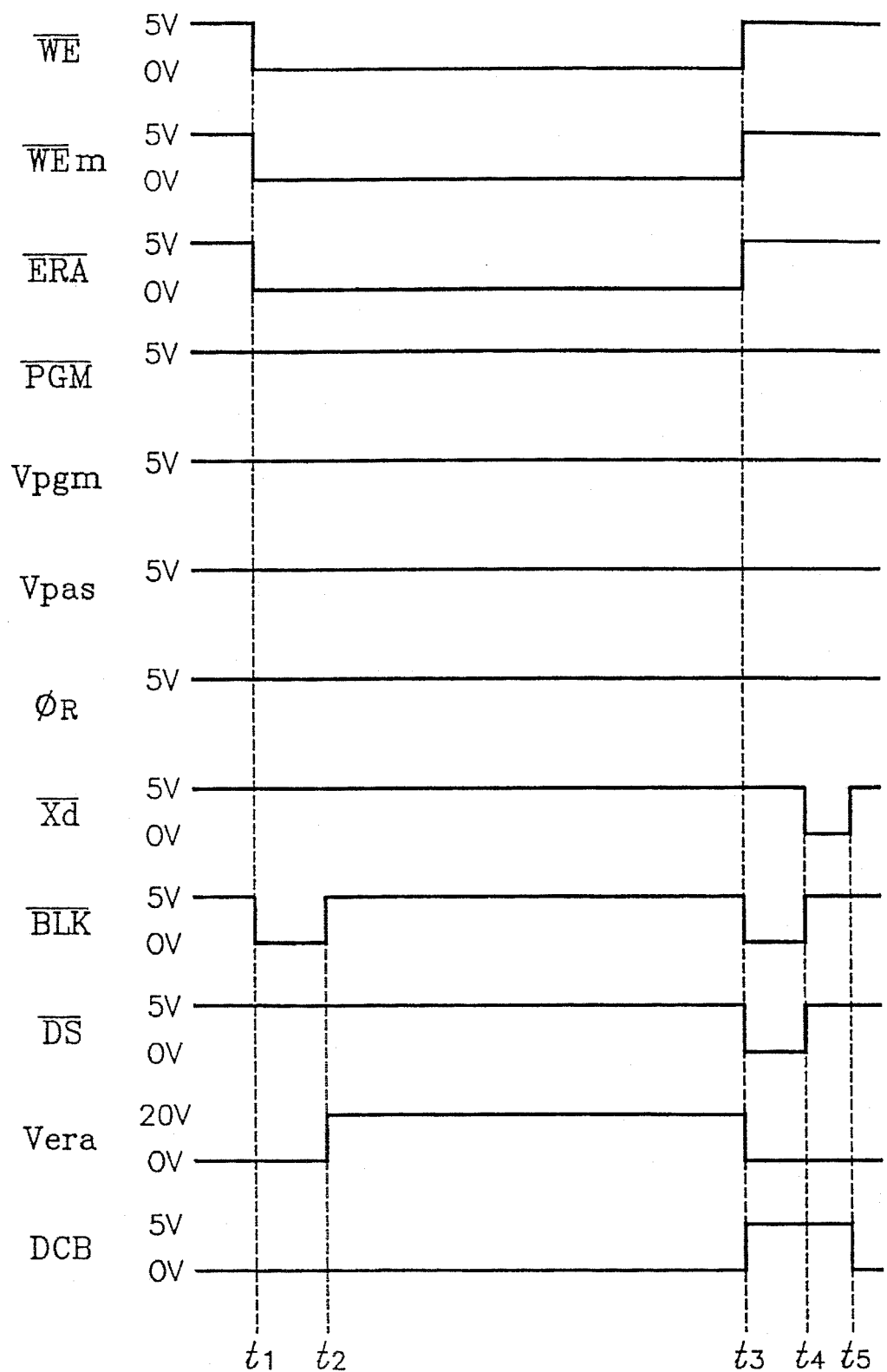
FIG. 16 shows a timing chart of various control signals used in a block erasing mode of the modified embodiment.

FIG. 16 shows a timing chart of the block erasing mode. In the drawing, the time period between $t_1$ and $t_2$ is for discharging all word lines in the memory array 10 to the reference potential of 0 volts. In this period, control gate lines CGL1 to CGL8 are at the reference potential as discussed in connection with FIG. 6. During this period, $\overline{BLK}$ maintains "L" level, and the predecoder (not shown) generates address signals Pl, Ql and Rl being at "H" levels in response to the signal $\overline{BLK}$. Thus, the decoder of FIG. 14 outputs "L" level. Consequently, block selection control lines BSC1 to BSC512 are all at the potential of about 4.3 volts, and transfer transistors BT2 to BT9 of transfer transistor arrays 34-1 to 34-512 of FIG. 13a are all turned on, thereby grounding all word lines.

The time period between $t_2$ and $t_3$ of FIG. 16 is for erasing a selected memory block. During the period, control gate lines CGL1 to CGL8 remain the reference potential identical to the case between $t_1$ to $t_2$. The block selection control circuit 318 of FIG. 14 associated with the selected memory block outputs the potential of about 4.3 volts onto a selected block selection control line. However, the block selection control circuits associated with unselected memory blocks output the reference potential onto unselected block selection control lines. Thus, word lines of upper and lower memory blocks in the selected memory block at time $t_2$ are all at the reference potential, and all of word lines in unselected memory block are in floating states. However, since the erase voltage $V_{era}$ of 20 volts is applied to the well electrode 114 of FIG. 4 at time $t_2$, all word lines in the unselected memory blocks are capacitively coupled to about 20 volts, and data of memory transistors in the unselected memory blocks is not erased. However, during the time period between $t_2$ and $t_3$, every memory transistor in the selected memory block is changed into a D-type transistor having a threshold voltage of about –2 to –3 volts by the erase voltage which is applied between its channel and control gate. That is, logic "0" data is stored.

On the other hand, during the block erasing period between $t_2$ and $t_3$, since the selected block selection control line is at the potential of about 4.3 volts, and upper and lower selection gate lines USGLi and LSGLi are at about 2 to 3 volts, and upper and lower ground selection lines UGSL and LGSL are at 5 volts, the first upper and lower selection lines USL1 and LSL1 associated with the selected memory block are at about 2 to 3 volts and the second upper and lower selection lines USL2 and LSL2 associated with the selected memory block are in floating states. Thus, when any one of the second upper and lower transistors connected with the second upper and lower selection lines fails, the flow of leakage current is prevented via the second upper and lower selection lines USL2 and LSL2 from the well electrode 114. During the block erasing operation, the voltage relationship of significant portions may be summarized in the following TABLE 4.

TABLE 4

|  | Selected Memory Block | Unselected Memory Block |
| --- | --- | --- |
| First Upper And Lower Selection Lines USL1 And LSL1 | Approximately 2–3V | Floating |
| Word Lines WL1 to WL8 | 0V | Approximately 20V |
| Second Upper And Lower Selection Lines USL2 And LSL2 | Floating | Floating |
| Well Electrode | 20V | 20V |

The time period between $t_3$ and $t_4$ of FIG. 16 is for discharging word lines in unselected memory blocks to the reference potential. During this period, control gate lines CGL1 to CGL8 maintain the reference potential by the control signal $\overline{DS}$ as previously discussed in connection with FIG. 6. The control signal $\overline{BLK}$ maintains all block selection control lines BSC1 to BSC512 to about 4.3 volts, thereby causing all word lines to be discharged to the reference potential. Upper and lower gate lines UGLi and LSGLi are also maintained at the reference potential by $\overline{Xd}$. On the other hand, the line DCB being at "H" level causes bit lines to be discharged to the reference potential.

Figure 17:
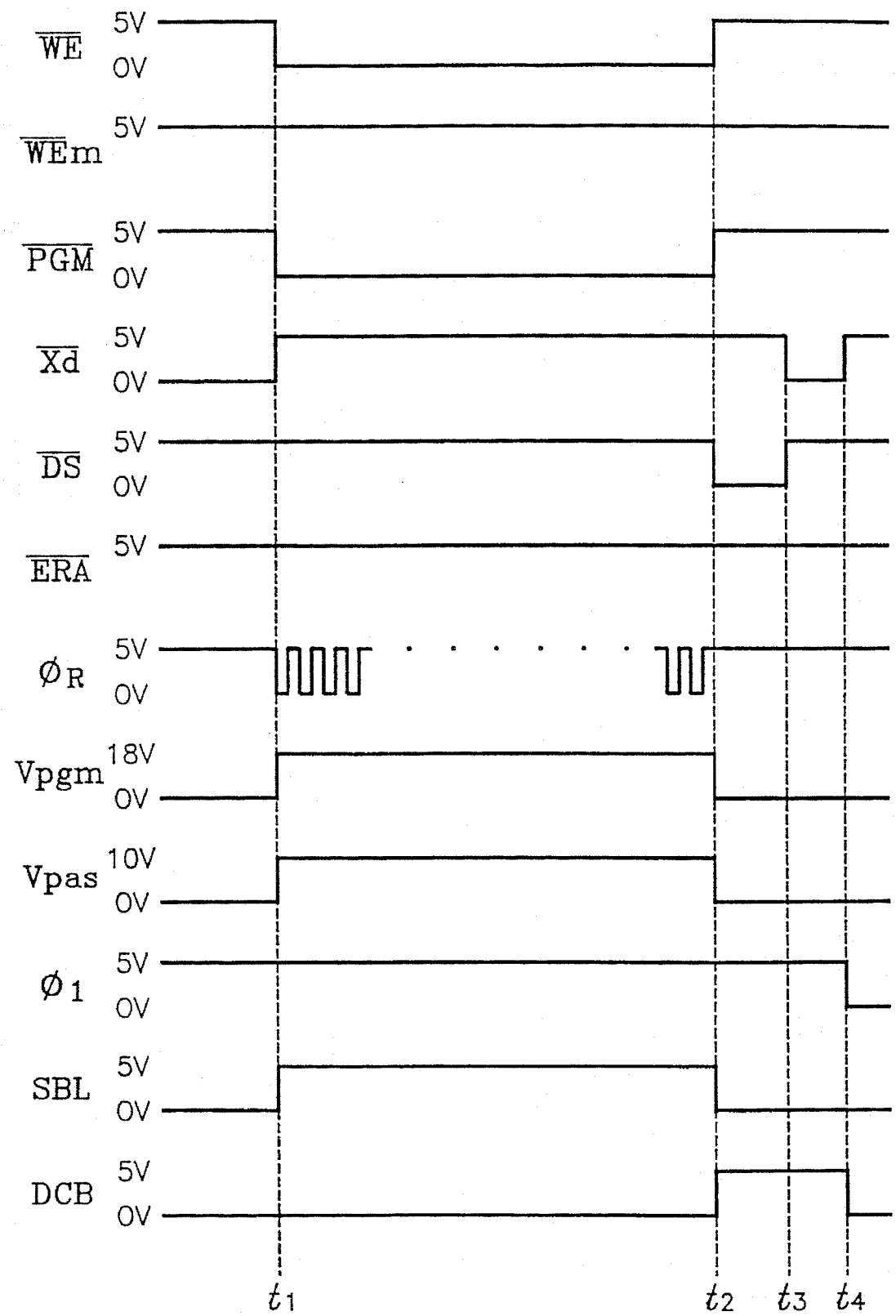
FIG. 17 shows a timing chart of various control signals used in a programming mode of the modified embodiment.

FIG. 17 shows a timing chart of the programming mode of the modified embodiment. Referring to FIG. 17, the data loading operation is performed prior to time $t_1$. The data loading operation is performed in the same manner as that of the first embodiment as discussed in connection with FIG. 2b. The time period between $t_1$ and $t_2$ is for writing data into selected memory transistors. As discussed in the data loading operation of the first embodiment, bit lines corresponding to memory transistors into which logic "1" data is written are at "L" level of 0 volts while bit lines corresponding to memory transistors into which logic "0" data is written are at "H" levels of 5 volts. After the time $t_1$, the selected control gate line goes to the program voltage $V_{pgm}$ of 18 volts, and unselected control gate lines go to the pass voltage $V_{pas}$ of 10 volts as previously discussed in connection with FIG. 6. It is now assumed that the fourth control gate line CGL4 was designated by address signals. Then, the control gate line CGL4 goes to the program voltage $V_{pgm}$ of 18 volts and control gate lines CGL1 to CGL3 and CGL5 to CGL8 go to the pass voltage $V_{pas}$ of 10 volts. It is also assumed that the third memory block was designated by address signal and the address signal $A_{11}$ was "H" level. Then, the decoder 322 of FIG. 14 outputs "L" level and the block selection control line BSC3 goes to the program voltage $V_{pgm}$ of 18 volts after the time $t_1$. At this time, the upper selection gate line USGL3 goes to the potential of 5 volts and the lower selection gate line LSGL3 goes to the reference potential. Thus, the transfer transistor array 34-3 of FIG. 13a is turned on. On the other hand, the ground line driving circuit 320 of FIG. 15 provides the reference potential onto the lines UGSL and LGSL during the programming period. Thus, the second upper and lower selection transistors UST2 and LST2 in the upper and lower memory blocks USBK3 and LSBK3 are all nonconductive. The first lower selection line LSL1 in the lower memory block LSBK3 also goes to the reference voltage via the transfer transistor BT11, thereby causing the first lower selection transistors LST1 to be turned off. However, the first upper selection line USL1 in the upper memory block USBK3 goes to "H" level of 5 volts via the transfer transistor BT1. During the above-mentioned programming operation, the voltage relationship of significant portions may be summarized in the following TABLE 5.

TABLE 5

| | Selected Memory Block | |
|---|---|---|
| | Selected Upper Memory Block | Unselected Lower Memory Block |
| Selected First Upper Selection Line USL1 | 5V | — |
| Unselected First Lower Selection Line LSL1 | — | 0V |
| Selected Word Line | $V_{pam}$ = 18V | $V_{pgm}$ = 18V |
| Unselected Word Line | $V_{pas}$ = 10V | $V_{pas}$ = 10V |

TABLE 5-continued

| | Selected Memory Block | |
|---|---|---|
| | Selected Upper Memory Block | Unselected Lower Memory Block |
| Selected Second Upper Selection Line USL2 | 0V | — |
| Unselected Second Lower Selection Line LSL2 | — | 0V |
| Well Electrode | 0V | 0V |

Thus, during the programming operation, the high voltage applied onto word lines WL1 to WL8 causes the NAND cell charging of upper and lower memory blocks USBK3 and LSBK3. Thus, since the first upper selection line USL1 is at the potential of 5 volts, and bit lines associated with memory transistors into which logic "0" data is written are at 5 volts while bit lines associated with memory transistors into which logic "1" data is written are at the reference potential of 0 volts, first upper selection transistors in the upper memory block USBK3 which are connected with the latter memory transistors are turned on, and first upper selection transistors in the memory block USBK3 which are connected with the former memory transistors are turned off. Thus, sources, drains and channels of memory transistors in NAND cells associated with the former memory transistors go to the reference potential, and NAND cells associated with the latter memory transistors are charged to a high voltage. Consequently, during the programming period, floating gates of the former memory transistors connected with the upper word line WL4 accumulate electrons by way of the F-N tunneling, thereby changing into enhancement transistors having a threshold voltage of about 0.8 volts. That is, logic "1" data is stored. However, since channels of the latter memory transistors and junction capacitors of their sources and drains are charged with a high voltage, the programming of these memory transistors is prevented.

In the same manner, the first lower selection line LSL1 and the second lower selection line LSL2 in the unselected lower memory block LSBK3 are at the reference potential, and the first and the second lower selection transistors LST1 and LST2 which are respectively connected to the lines LSL1 and LSL2 are thereby turned off. Thus, channels of memory transistors of NAND cells in the lower memory block LSBK3 and junction capacitors of their sources and drains are charged with a high voltage so as to prevent programming.

At the time $t_2$, the programming operation is terminated and the clock $\phi_R$ stops clocking. Thus, the charge pump circuit 348 is disabled and BSC3 thereby falls to the potential of 5 volts. During the time period between $t_2$ and $t_3$, the control signal $\overline{DS}$ at "L" level causes control gate lines CGL1 to CGL8 to be grounded. Thus, word lines in the memory block SBK3 are discharged to the reference potential. During the time period between $t_3$ and $t_4$, block selection control lines BSC1 to BSC512 and upper selection gate lines USGL1 to USGL512 are discharged to the reference potential.

The programming verification operation may be performed from the time $t_4$ of FIG. 17. The programming verification operation is similar to that of the first embodiment. The difference as compared with the first embodiment is in that the present embodiment has the block selection control circuit for selecting one of either the upper or lower memory block in a selected memory block. If the upper memory block USBKi in a selected memory block is selected by means of the block selection control circuit of FIG. 14 in the programming verification operation, a selected block selection control line BSCi goes to the potential of about 4.3 volts, and the upper selection gate line USGLi goes to the potential of 5 volts. Then, the ground line driving circuit 320 of FIG. 15 outputs "H" level of 5 volts onto the upper selection gate line UGSL and "L" level of 0 volts onto the lower selection gate line LGSL. As discussed in connection with the first embodiment with reference to FIG. 6, in the programming verification operation, a selected control gate line is at the program verifying voltage of 0.8 volts and unselected control gate lines are at the potential of 5 volts. Thus, the line BSCi of about 4.3 volts connected to the transfer transistor array 34-i of FIG. 13a goes to a potential of about 7 volts since the potential of 5 volts on the unselected control gate lines is transferred from drains of transfer transistors to their gates by way of capacitive coupling. This operation is also identical in a reading operation. Consequently, a selected word line in the upper memory block USBKi goes to the verifying voltage of 0.8 volts and unselected word lines go to the potential of 5 volts. The first and second upper selection lines USL1 and USL2 also go to the potential of 5 volts. Thus, second selection transistors UST2 in the block USBKi are turned on, thereby connecting NAND cells in the block USBKi to the grounded common source line CSL. However, the first and second lower selection lines LSL1 and LSL2 in the lower memory block LSBKi are at the reference potential and the block LSBKi are at the reference potential and the block LSBKi are at the reference potential and the block LSBKi is thereby unselected. The following programming verification and reprogramming operations are the same as operations explained in the first embodiment in connection with the timing chart during the time period between $t_2$ and $t_4$ of FIG. 12.

In the modified embodiment, programming and reprogramming techniques do not need a program inhibition voltage generator connected with the respective bit lines to inhibit programming of logic "0" programmed cells and reprogramming of successfully logic "1" programmed cells. Thus, the simplification of a peripheral circuit and the reduction of on-chip area can be accomplished. Otherwise, since the program inhibition voltage is automatically generated by the capacitive coupling technique during the programming and reprogramming operations, the programming and reprogramming operations may be executed at a high speed. Thus, since the present embodiment employs a selfprogram inhibition technique, the above-mentioned advantages may be accomplished.

In the reading operation of the modified embodiment, a selected word line of 0 volts is used instead of the selected word line of 0.8 volts in the above-mentioned programming verification operation. Operation to select memory transistors in the reading operation is the same as that in the programming verification operation. Page reading, page read-out sensing and the output from data output terminals are also the same as operations explained in the first embodiment in connection with FIG. 12.

Thus, EEPROMs of embodiments of the present invention as described above can be designed so as to have capabilities and reliability of improved programming, block erasing and programming verification. The peripheral circuits associated with a reading and a programming verification according to embodiments of the invention can also be used in a nonvolatile semiconductor memory with a NOR-type memory array.

What is claimed is:

1. A nonvolatile semiconductor memory comprising:

a plurality of bit lines;

a multiplicity of cell units arranged in rows and columns, each of said cell units including at least one memory transistor having a floating gate serving as a charge storage layer, and a control gate, each of said cell units in respective ones of said columns being operably connected in parallel between corresponding ones of said bit lines and a reference potential;

a current source circuit for supplying a predetermined amount of electric current to each of said bit lines during both a data reading mode and a program verifying mode of operation of the memory;

a control circuit for applying a read voltage to the control gates of memory transistors selected from one of said rows during said data reading mode, applying a program voltage to the control gates of memory transistors selected from one of said rows during a data program mode of operation of the memory, and applying a program verifying voltage during said program verifying mode to the control gates of said memory transistors selected from one of said rows during said data program mode; and a plurality of data latch circuits connected to respective ones of said bit lines, said data latch circuits storing program data to be programmed into said memory transistors selected during said data program mode, sensing and storing read-out data in response to said electric current supplied to said bit lines through said memory transistors selected during said data reading mode, and sensing and storing verify data in response to said electric current supplied to said bit lines through said memory transistors selected during said program verifying mode.

2. A nonvolatile semiconductor memory according to claim 1, wherein said current source circuit continues to supply said predetermined amount of current to said bit lines while said data latch circuits sense and store data during said data reading and said program verifying modes of operation of the memory.

3. A nonvolatile semiconductor memory according to claim 2, wherein said bit lines are not precharged to a predetermined potential before said data latch circuits sense and store data during said data reading and said program verifying modes of operation of the memory.

4. A nonvolatile semiconductor memory according to claim 1, wherein said bit lines are not precharged to a predetermined potential before said data latch circuits sense and store data during said data reading and said program verifying modes of operation of the memory.

5. A nonvolatile semiconductor memory according to claim 1, wherein said current source circuit includes:

a power source terminal;

a plurality of current source transistors, each of said current source transistors having
a control electrode, and
a current path formed between a respective one
of said bit lines and said power source terminal; and a common reference circuit connected to the control electrode of each of said current source transistors.

6. A nonvolatile semiconductor memory according to claim 5, wherein each of said data latch circuits includes:

a data sensing transistor having
a control electrode connected to a corresponding one of said bit lines,
a source electrode connected to said reference potential, and a drain;

a first node connected to the drain of said data sensing transistor;

a second node connected to said corresponding one of said bit lines through an isolation transistor; and a pair of inverters cross-connected between said first and second nodes.

7. A nonvolatile semiconductor memory according to claim 1, wherein each of said data latch circuits includes:

a data sensing transistor having
   a control electrode connected to a corresponding one of said bit lines,
   a source electrode connected to said reference potential, and
   a drain;

a first node connected to the drain of said data sensing transistor;

a second node connected to said corresponding one of said bit lines through an isolation transistor; and a pair of inverters cross-connected between said first and second nodes.

8. A nonvolatile semiconductor memory comprising:

a plurality of bit lines;

a plurality of memory cells arranged in rows and columns, each of said memory cells including a floating gate and a control gate, each of said memory cells in respective ones of said columns connected in parallel between corresponding ones of said bit lines and a reference potential;

a row decoder connected to the control gates of each of said memory cells in respective ones of said rows, said row decoder selecting each of said memory cells in a desired row, and causing said desired row of memory cells to read out data onto respective ones of said bit lines during both a data read operation and a program verifying operation of said memory;

a current source circuit for supplying current to each of said bit lines; and a plurality of data latch circuits connected to respective ones of said bit lines, each of said data latch circuits being responsive to said current supplied to each of said bit lines through a corresponding one of said desired row of memory cells, said data latch circuits sensing and storing data read out onto said bit lines.

9. A nonvolatile semiconductor memory according to claim 8, wherein said current source circuit continues to supply said current to said bit lines while said data latch circuits sense and store data read out onto said bit lines.

10. A nonvolatile semiconductor memory according to claim 9, wherein said bit lines are not precharged to a predetermined potential before said data latch circuits sense and store data read out onto said bit lines.

11. A nonvolatile semiconductor memory according to claim 8, wherein said bit lines are not precharged to a predetermined potential before said data latch circuits sense and store data read out onto said bit lines.

12. A nonvolatile semiconductor memory comprising:

a plurality of cell units arranged in rows and columns, each of said cell units including
   a first terminal connected to a reference potential,
   a second terminal, and
   a plurality of memory transistors connected in series between said first terminal and said second terminal, each of said memory transistors having a floating gate and a control gate;

a plurality of bit lines connected to the second terminal of each cell unit in respective ones of said columns;

a row decoder connected to the control gates of each of said memory transistors, said row decoder selecting a selected memory transistor in each respective cell unit in one of said rows of cell units, and rendering conductive remaining ones of memory transistors in each respective cell unit in said one of said rows, said row decoder enabling said selected memory transistor to read out data;

a current source circuit for supplying electric current to each of said bit lines; and a plurality of data latch circuits connected to respective ones of said bit lines, each of said data latch circuits being responsive to said electric current supplied to said bit lines and flowing through said selected memory transistor for sensing and storing data read out onto said bit lines.

13. A nonvolatile semiconductor memory according to claim 12, wherein said current source circuit continues to supply said current to said bit lines while said data latch circuits sense and store data read out onto said bit lines.

14. A nonvolatile semiconductor memory according to claim 13, wherein said bit lines are not precharged to a predetermined potential before said data latch circuits sense and store data read out onto said bit lines.

15. A nonvolatile semiconductor memory according to claim 12, wherein said bit lines are not precharged to a predetermined potential before said data latch circuits sense and store data read out onto said bit lines.

16. In an electrically erasable and programmable read only memory having a plurality of cell units connected in parallel between a bit line and a reference potential, each of said cell units including a plurality of series-connected memory transistors, each of said memory transistors having a floating gate and a control gate, and a row decoder for selecting one of said cell units and one of said memory transistors of said selected cell unit, and for rendering conductive remaining unselected memory transistors of said selected cell unit and enabling said selected one of said memory transistors to read out onto said bit line data stored in said selected one of said memory transistors, wherein the improvement comprises:

a current source circuit for supplying a current to said bit line; and a data latch circuit connected to said bit line for sensing and storing said data in response to whether or not said current applied to said bit line flows through said selected one of said memory transistors.

17. An electrically erasable and programmable read only memory according to claim 16, wherein said current source circuit continues to supply said current to said bit line while said data latch circuit senses and stores data.

18. An electrically erasable and programmable read only memory according to claim 17, wherein said bit line is not precharged to a predetermined potential before said data latch circuit senses and stores data.

19. An electrically erasable and programmable read only memory according to claim 16, wherein said bit line is not precharged to a predetermined potential before said data latch circuit senses and stores data.

20. An electrically erasable and programmable read only memory according to claim 16, wherein said current source circuit includes:

a power source terminal;

a current source transistor having a control electrode, and a current path connected between said bit line and said power source terminal; and a common reference circuit connected to said control electrode of said current source transistor.

21. An electrically erasable and programmable read only memory according to claim 20, wherein said data latch circuit includes:

a data sensing transistor having
- a control electrode connected to said bit line,
- a source electrode connected to said reference potential, and
- a drain;

a first node connected to said drain of said data sensing transistor;

a second node connected to said bit line through an isolation transistor; and a pair of inverters cross-connected between said first and second nodes.

22. An electrically erasable and programmable read only memory according to claim 16, wherein said data latch circuit includes:

a data sensing transistor having
- a control electrode connected to said bit line,
- a source electrode connected to said reference potential, and
- a drain;

a first node connected to said drain of said data sensing transistor;

a second node connected to said bit line through an isolation transistor; and a pair of inverters cross-connected between said first and second nodes.

23. In an electrically erasable and programmable read only memory having a plurality of memory transistors connected in parallel between a bit line and a reference potential, each of said memory transistors having a floating gate and a control gate, and a row decoder for selecting one of said memory transistors and enabling said selected one of said memory transistors to read out a stored data onto said bit line, wherein the improvement comprises:

a current source circuit for supplying current to said bit line; and a data latch circuit connected to said bit line for sensing and storing said stored data in response to whether or not said current supplied to said bit line flows through said selected one of said memory transistors.

24. An electrically erasable and programmable read only memory according to claim 23, wherein said current source circuit continues to supply said current to said bit line while said data latch circuit senses and stores data.

25. An electrically erasable and programmable read only memory according to claim 24, wherein said bit line is not precharged to a predetermined potential before said data latch circuit senses and stores data.

26. An electrically erasable and programmable read only memory according to claim 23, wherein said bit line is not precharged to a predetermined potential before said data latch circuit senses and stores data.

27. An electrically erasable and programmable read only memory comprising:

an array of rows and columns of memory transistors, each of said memory transistors having a control gate and a floating gate, each of said columns having a plurality of cell units comprised of a plurality of adjacent memory transistors, said adjacent memory transistors being connected in series such that said cell units are arranged in rows and columns;

a plurality of bit lines, each of said cell units in respective ones of said columns connected in parallel between a corresponding one of said bit lines and a reference potential;

a row decoder connected to the control gates of respective ones of said memory transistors in each row, said row decoder selecting a desired row of cell units and one of said adjacent memory transistors in each of said desired row of cell units, and rendering conductive remaining unselected ones of said memory transistors in each of said desired row of cell units, said row decoder enabling said selected one of said adjacent memory transistors to read out a stored data onto said corresponding one of said bit lines;

a current source circuit for supplying a substantially constant current to each of said bit lines, and a plurality of data latch circuits connected to respective ones of said bit lines, each of said data latch circuits being responsive to said current supplied to said bit lines and flowing through a corresponding one of said selected one of said adjacent memory transistors for sensing and storing data read out onto said bit lines.

28. An electrically erasable and programmable read only memory according to claim 27, wherein said current source circuit continues to supply said substantially constant current to said bit lines while said data latch circuits sense and store data read out onto said bit lines.

29. An electrically erasable and programmable read only memory according to claim 28, wherein said bit lines are not precharged to a predetermined potential before said data latch circuits sense and store data read out onto said bit lines.

30. An electrically erasable and programmable read only memory according to claim 27, wherein said bit lines are not precharged to a predetermined potential before said data latch circuits sense and store data read out onto said bit lines.

* * * * *